(12) United States Patent
Grigoropoulos et al.

(10) Patent No.: US 7,682,970 B2
(45) Date of Patent: Mar. 23, 2010

(54) MASKLESS NANOFABRICATION OF ELECTRONIC COMPONENTS

(75) Inventors: Constantine P. Grigoropoulos, Berkeley, CA (US); Seung-Hwan Ko, Berkeley, CA (US); Jaewon Chung, Jang-ahn (KR); Dimos Poulikakos, Zollikon (CH); Heng Pan, Albany, CA (US)

(73) Assignee: The Regents of the University of California, Oakland, CA (US)

( * ) Notice: Subject to any disclaimer, the term of this patent is extended or adjusted under 35 U.S.C. 154(b) by 605 days.

(21) Appl. No.: 11/478,294

(22) Filed: Jun. 29, 2006

(65) Prior Publication Data

US 2010/0035375 A1 Feb. 11, 2010

Related U.S. Application Data

(63) Continuation-in-part of application No. 10/621,046, filed on Jul. 16, 2003, now Pat. No. 7,087,523.

(51) Int. Cl.
*H01L 21/44* (2006.01)

(52) U.S. Cl. .............. 438/662; 438/940; 257/E21.582

(58) Field of Classification Search ................ 438/662, 438/679, 940, 962; 257/E21.582
See application file for complete search history.

(56) References Cited

U.S. PATENT DOCUMENTS 4,910,118 A   3/1990   Adair et al. ............... 430/138
5,391,841 A   2/1995   Quick ....................... 174/258
6,331,056 B1  12/2001  Nohr et al. ................ 347/102
6,348,295 B1 * 2/2002  Griffith et al. ............ 430/198
7,087,523 B2  8/2006   Grigoropoulos et al. ... 438/662
2002/0081397 A1 6/2002 McGill et al. ............. 427/596
2003/0047816 A1 3/2003 Dutta ....................... 257/788
2003/0080426 A1 * 5/2003 Klauk et al. .............. 257/744

FOREIGN PATENT DOCUMENTS

| EP | 0 4517 294 | 3/1991 |
| JP | 11-350107 | 12/1999 |
| JP | 2000-104101 | 4/2000 |
| WO | WO 99/53738 | 10/1999 |
| WO | WO 00/10197 | 2/2000 |

OTHER PUBLICATIONS

N.R. Bieri et al, "Microstructuring by printing and laser curing of nanoparticle solutions", Applied Physics Letters, vol. 82, No. 20, May 19, 2003, pp. 3529-3531.

(Continued)

*Primary Examiner*—Chandra Chaudhari
(74) *Attorney, Agent, or Firm*—Bret E. Field; Bozicevic, Field & Francis LLP

(57) ABSTRACT

The present invention relates to systems, materials and methods for the formation of conducting, semiconducting, and dielectric layers, structures and devices from suspensions of nanoparticles. Drop-on-demand systems are used in some embodiments to fabricate various electronic structures including conductors, capacitors, FETs. Selective laser ablation is used in some embodiments to pattern more precisely the circuit elements and to form small channel devices.

19 Claims, 28 Drawing Sheets

OTHER PUBLICATIONS

N.R. Bieri et al, "Manufacturing of Electrically Conductive Microstructures by Dropwise Printing and Laser Curing of Nanoparticle-Suspensions", Proceedings of IMECE2002, ASME International Mechanical Engineering Congress & Exposition, (© 2002 ASME), Nov. 17-22, 2002, New Orleans, Louisiana, pp. 1-8.

D.B. Bogy et al, "Experimental and Theoretical Study of Wave Propagation Phenomena in Drop-on-Demand Ink Jet Devices", IBM J. Res. Develop., vol. 28, No. 3, May 1984, pp. 314-321.

Ph. Buffat et al, "Size effect on the melting temperature of gold particles", Physical Review A, vol. 13, No. 6, Jun. 1976, pp. 2287-2298.

Jaewon Chung et al, "Conductor microstructures by laser curing of printed gold nanoparticle ink", Applied Physics Letters, vol. 84, No. 5, Feb. 2, 2004, pp. 801 803.

Jaewon Chung et al, "Damage-Free Low Temperature Pulsed laser Printing of Gold Nanoinks On Polymers", Transactions of the ASME (© 2005), vol. 127, Jul. 2005, pp. 724 732.

J. Chung et al, "In-tandem deposition and sintering of pritned gold nanoparticle inks induced by continuous Gaussian laser irradiation", Appl. Phys. A, vol. 79 (2004), pp. 1259-1261.

J.F. Dijksman, "Hydrodynamics of small tubular pumps", J. Fluid Mech. (1984), vol. 139, pp. 173-191.

Cédric P.R. Dockendorf et al, "Multilayer Direct-Writing of Electrical Conductors with Gold Nanoinks Using the Fountain-Pen Principle", Proceedings of IPACK2005, ASME InterPACK '05, (© 2005 by ASME), Jul. 17 22, 2005, San Francisco, CA, pp. 1-3.

Sawyer Fuller et al, "Ink Jet Fabricatied Nanoparticle Mems", Proceedings IEEE 13th Annual International Conference of Micro Electro Mechanical Systems IEEE 2000, Piscataway, NJ (© 2000 IEEE), pp. 138-141.

Sawyer B. Fuller et al "Ink-Jet Printed Nanoparticle Microelectromechanical Systems", Journal of Microelectromechanical Systems, vol. 11, No. 1, Feb. 2002 (© 2002 IEEE), pp. 54-60.

Takeo Kawasa et al, "Inkjet Printing of Polymeric Field Effect Transistors and Its Applications", Japanese Journal of Applied Physics, vol. 44, No. 6A, (© 2005), pp. 3649-3658.

Seung Hwan Ko et al, "Fabrication of Inkjet Printed Flexible Electronics by Low Temperature Substractive Laser Processing", Proceedings of IMECE2005, 2005 ASME International Mechanical Engineering Congress and Exposition, Nov. 5-11, 2005 (© 2005 by ASME), Orlando, Florida, pp. 1-5.

Seung Hwan Ko et al, "Fabrication of Multilayer Passive Electric components using Injet Printing and Low Temperature Laser Processing on Polymer", SPIE Photonics West, San Jose, CA, Jan. 21-26, 2006, 5 two-sided pages.

Seung Hwan Ko et al, "Laser based hybrid inkjet printing of nanoink for flexible electronics", SPIE Photonics West, San Jose, CA, Jan. 22-27, 2006, pp. 1-8.

Seung Hwan Ko et al, "Subtractive Laser Processing of Low Temperature Inkjet Printed Micro Electric Components of Functional Nano-Ink For Flexible Electronics", Proceedings of IPACK2005, ASME InterPACK '05, (© by ASME), Jul. 17-22, 2005, San Francisco, California, pp. 1-7.

Steven Molesa et al, "High-quality inkjet-printed multilevel interconnects and inductive components on plastic for ultra-low-cost RFID applications", Mat. Res. Soc. Symp. Proc., vol. 769 (© 2003), pp. H8.3.1-H8.3.6.

David Redinger et al, "An Ink-Jet-Deposited Passive Component Process for RFID", IEEE Transactions on Electron Devices, vol. 51, No. 12, Dec. 2004 (© 2004 IEEE), pp. 1978-1983.

G.V. Shivashankar et al, "Biomolecular recognition using submicron laser lithography", Applied Physics Letters, vol. 73, No. 3, Jul. 20, 1998 (© 1998 American Institute of Physics), pp. 417-427.

John B. Szczech et al, "Fine-Line Conductor Manufacturing Using Drop-On-Demand PZT Printing Technology", IEEE Transactions on Electronics Packaging Manufcturing, vol. 25, No. 1, Jan. 2002 (© 2002 IEEE), pp. 26 33.

J.Z. Wang et al, "Dewetting of conducting polymer inkjet droplets on patterned surfaces", nature materials, vol. 3, Mar. 2004 (© 204 Nature Publishing Group), pp. 171-176.

* cited by examiner

Example of a capacitor

Example of intersection of lines

*Polysterene that is jettable can for example be used with good properties (Horowitz and Hill, *The Art of Elctronics*, Cambridge)

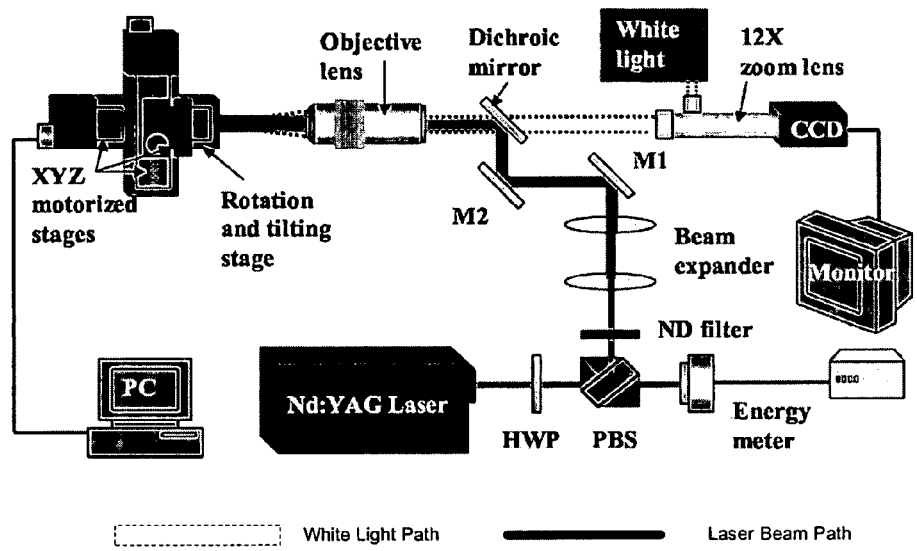
Fig. 10(a-1): Schematic Depiction of Nanosecond Laser Ablation

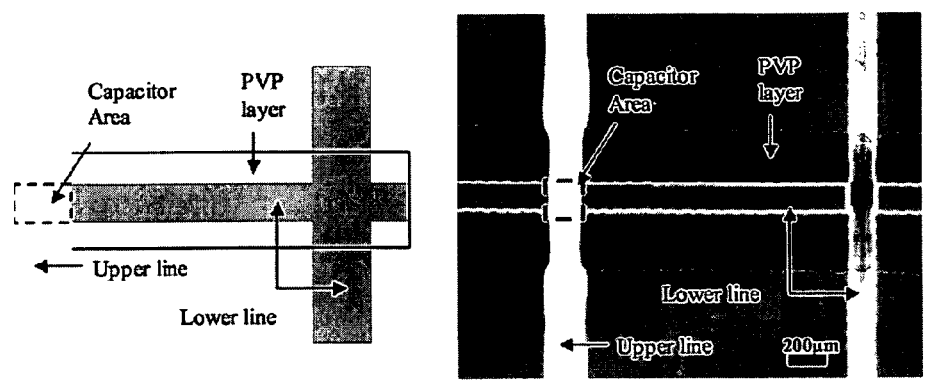
Fig. 11(a-4): Crossover capacitor schematics on polyimide film. PVP layer is sandwiched between lower and upper line. The lower line is under PVP layer and the upper line is above the PVP layer.

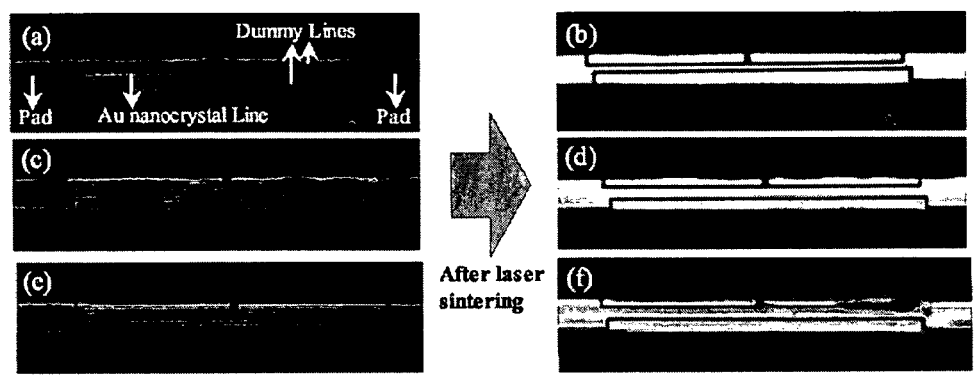
Fig. 12(a-2).

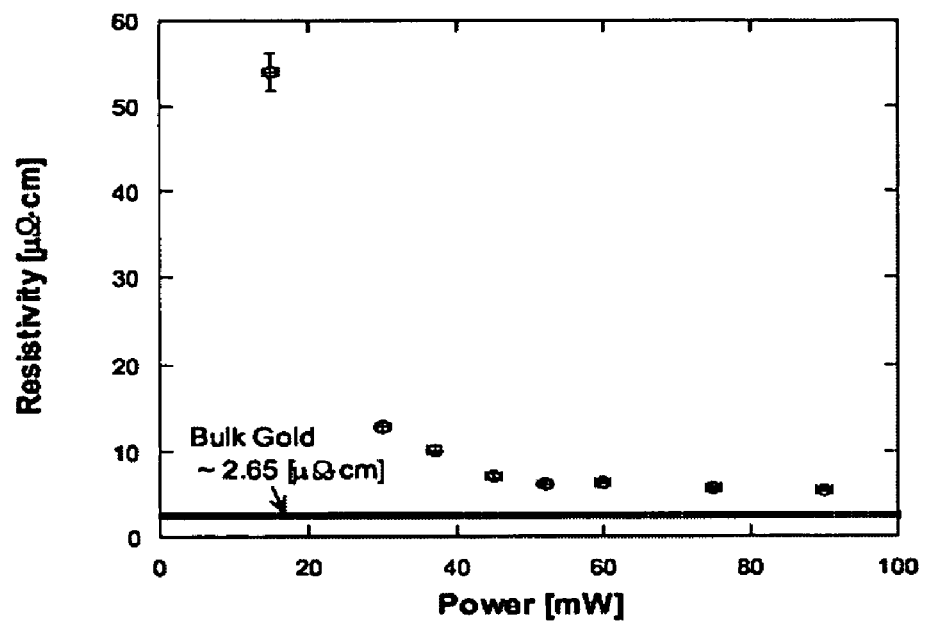
Fig. 13(a-3).

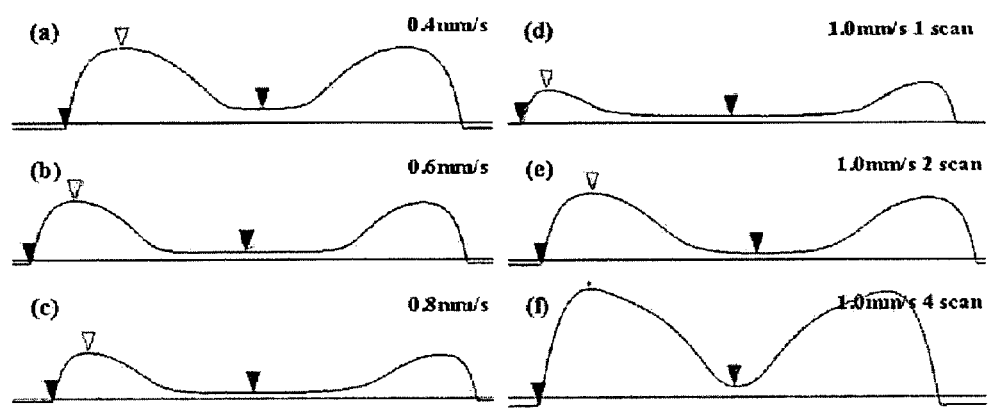
Fig. 14(a-5).

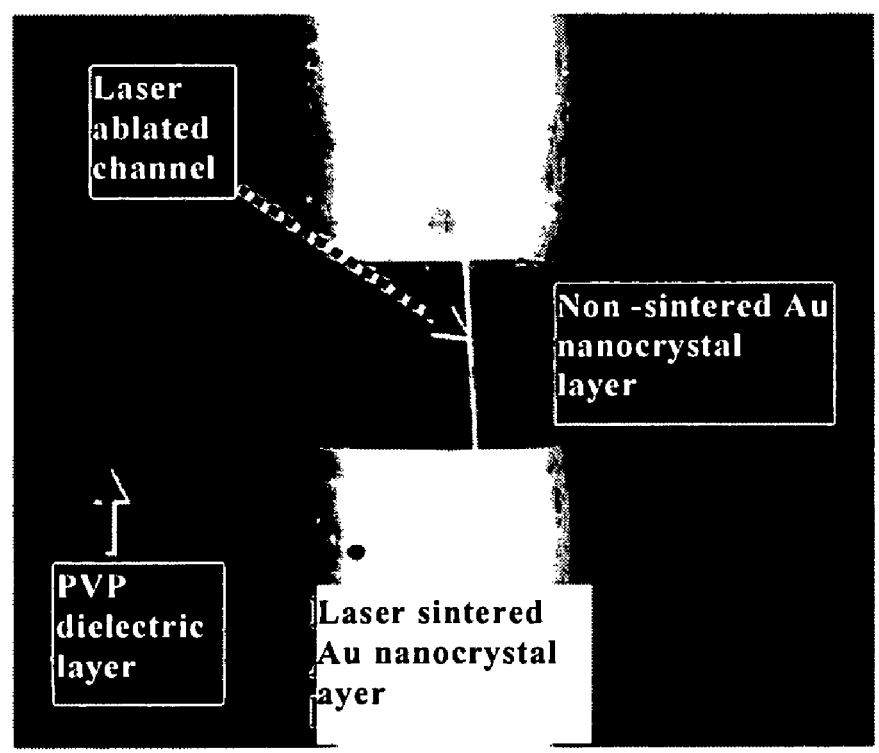
Fig. 15(a-6).

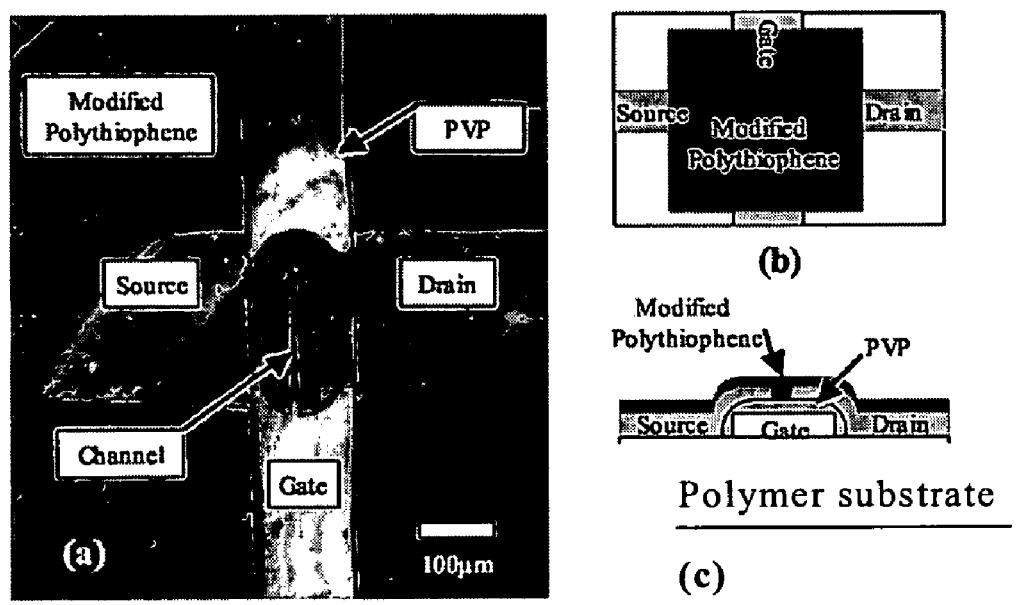
Fig. 16(a-7).

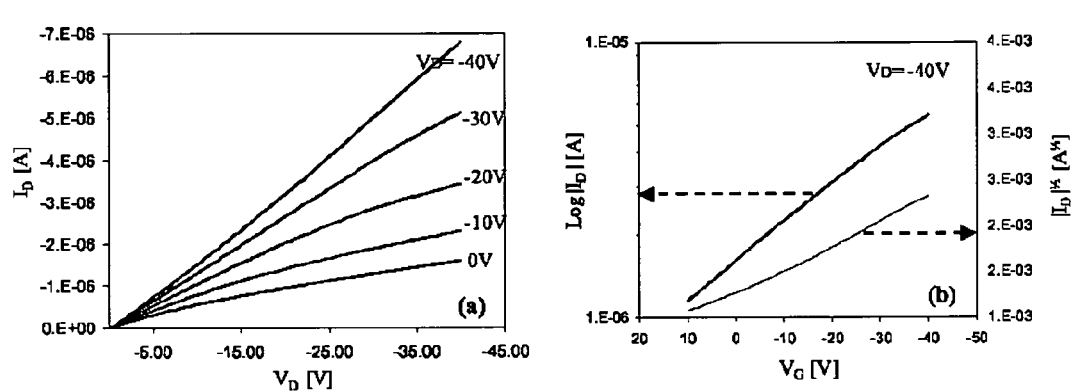
Fig. 17(a-8).

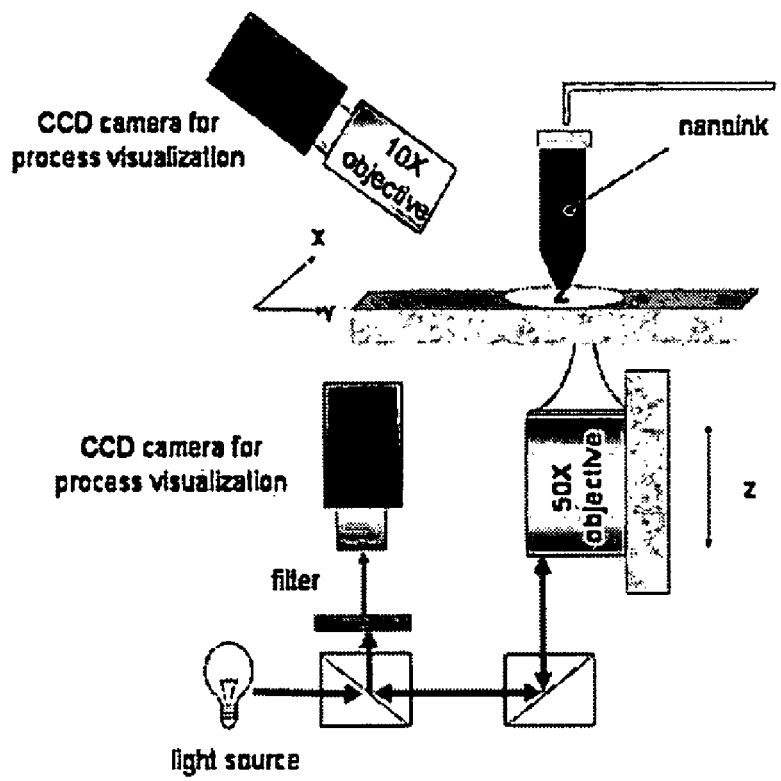
Fig. 18(b-1).

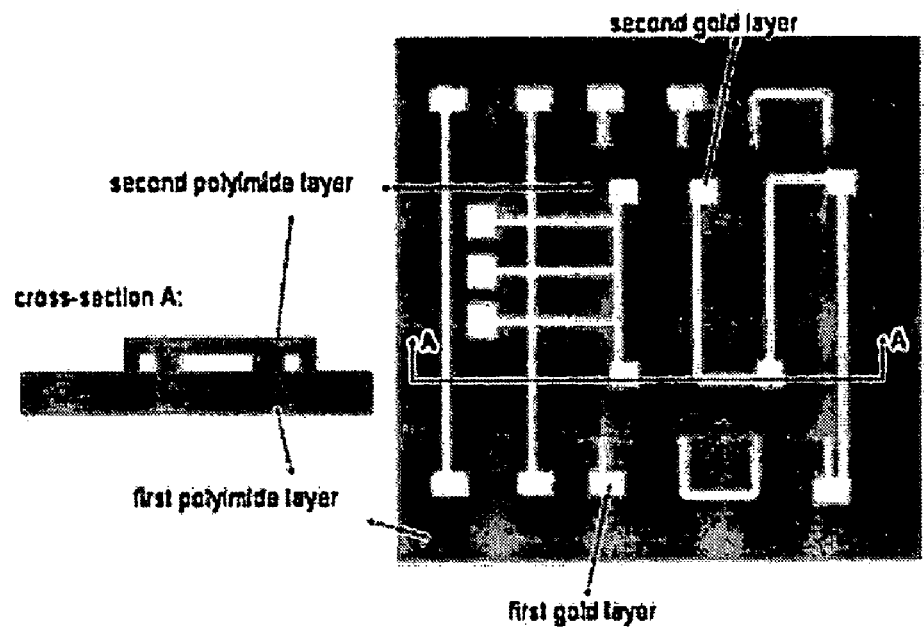
Fig. 19(b-2).

Fig. 20(b-3).

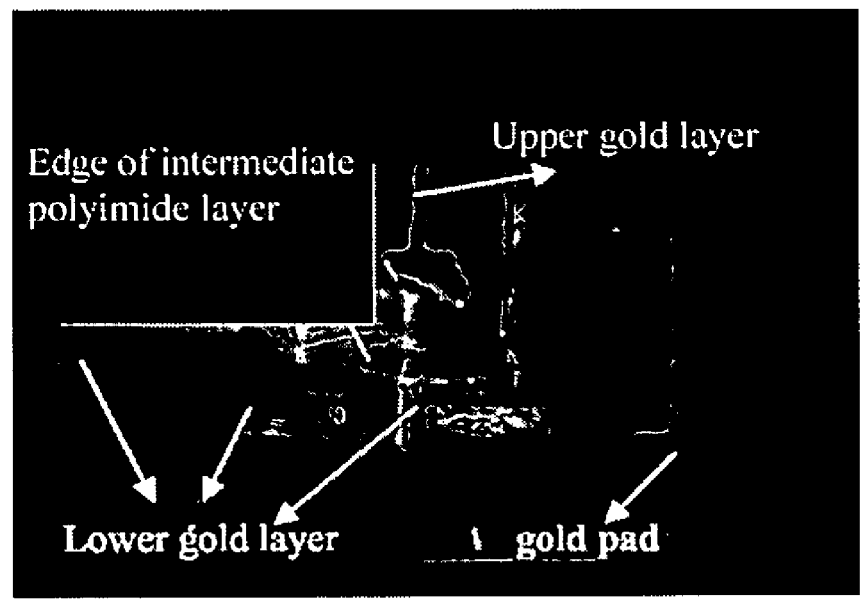
Fig. 21(b-4).

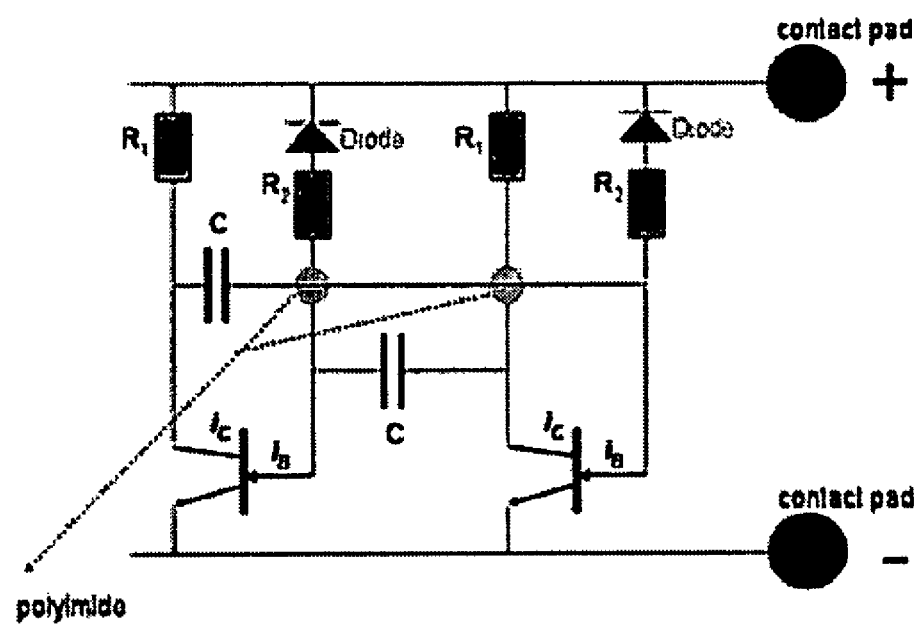
Fig. 22(b-5).

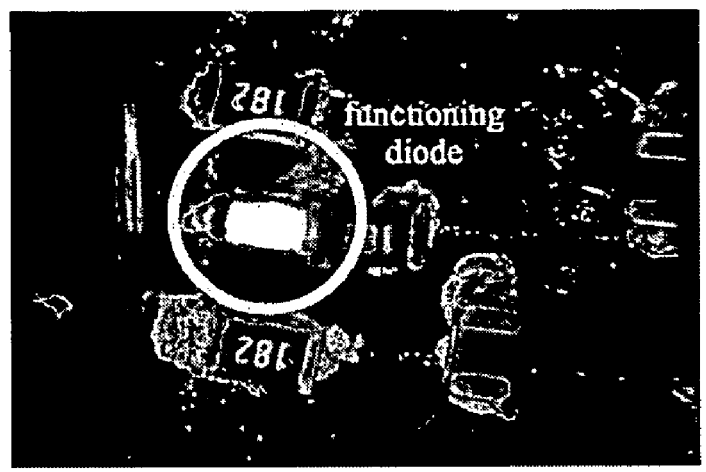
Fig. 23(b-6).

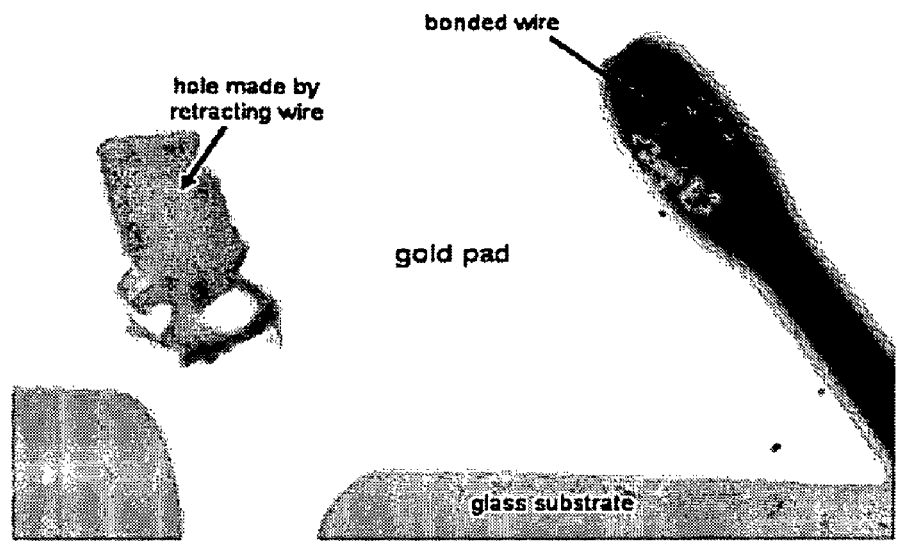
Fig. 24(b-7).

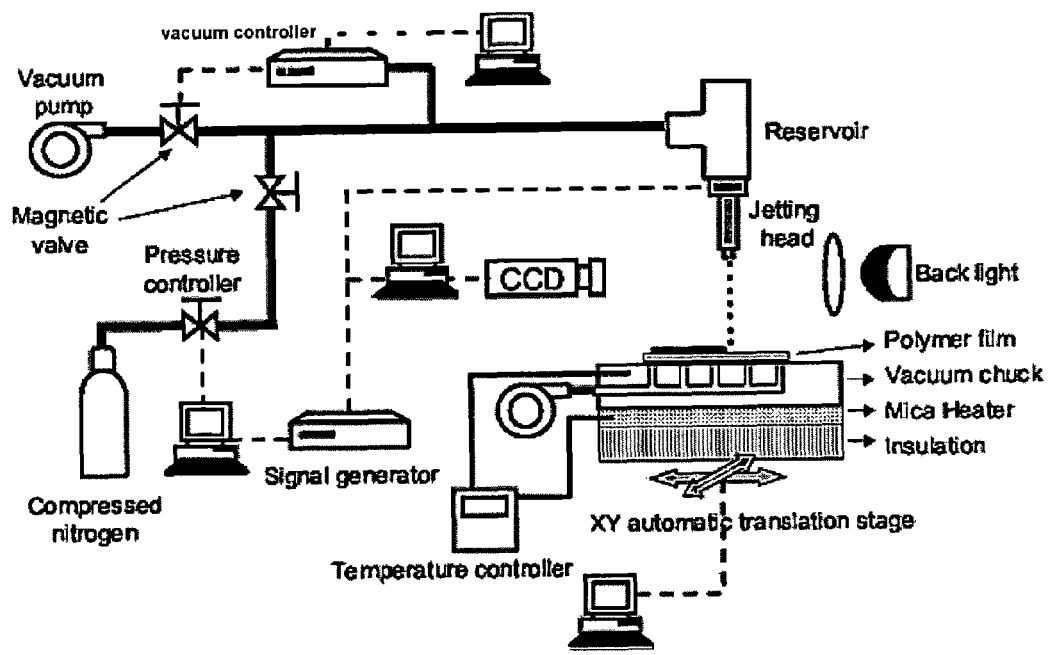
Fig. 25 (c-1).

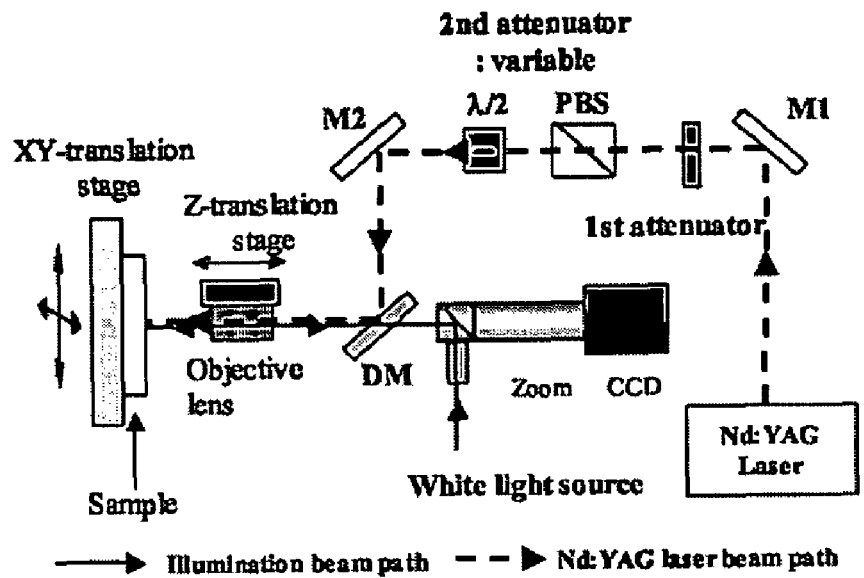
Fig. 26 (c-2).

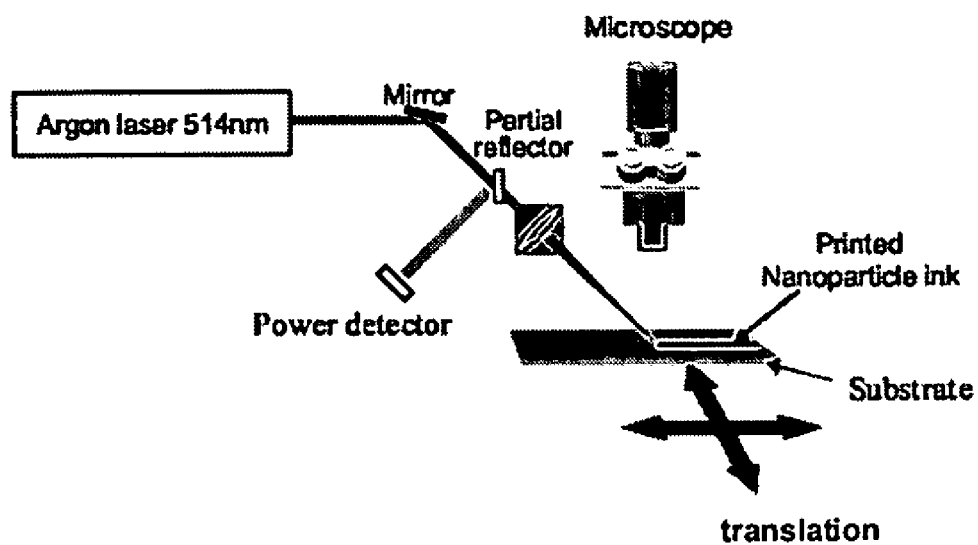
Fig. 27(c-3).

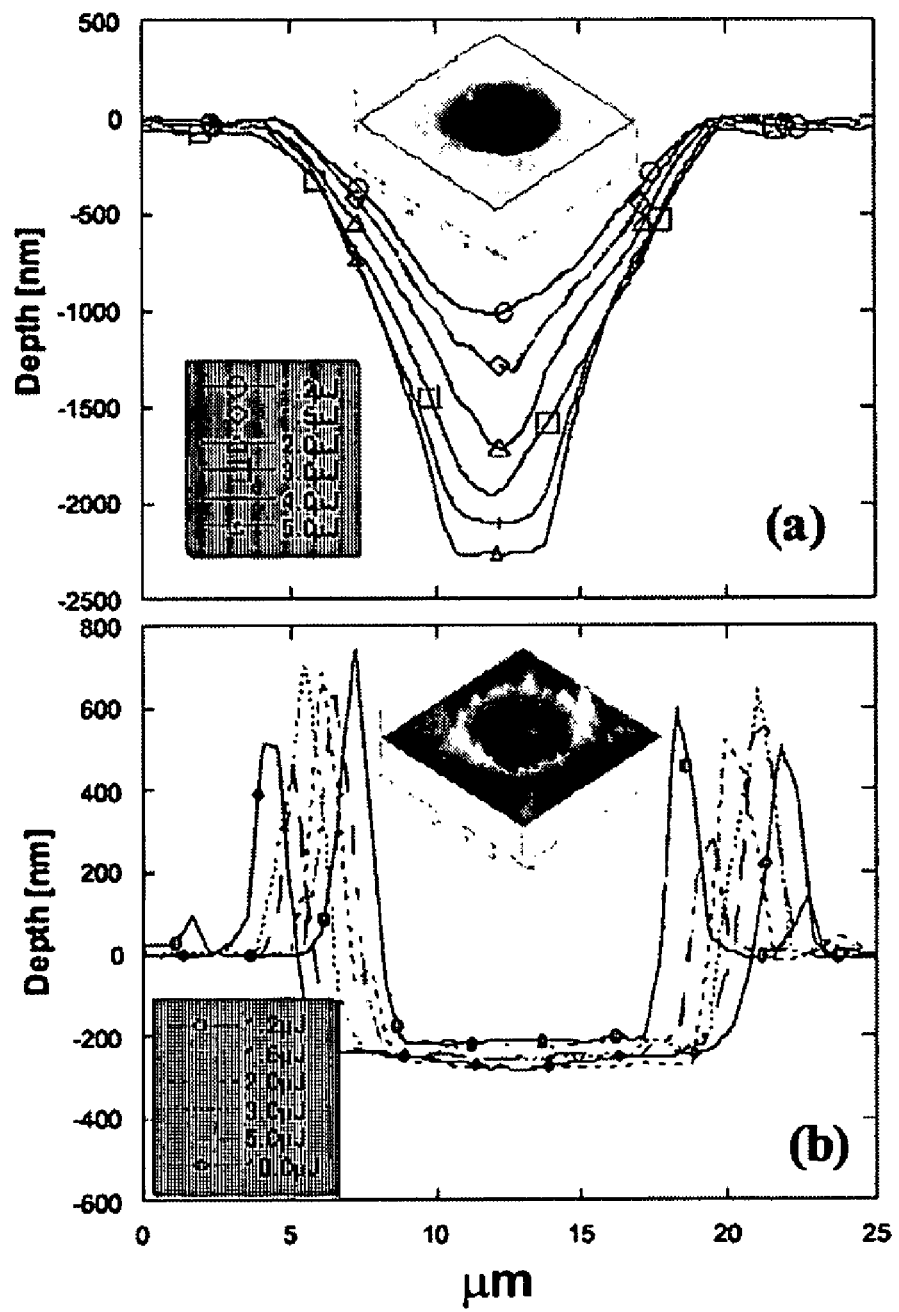
Fig. 28(c-4).

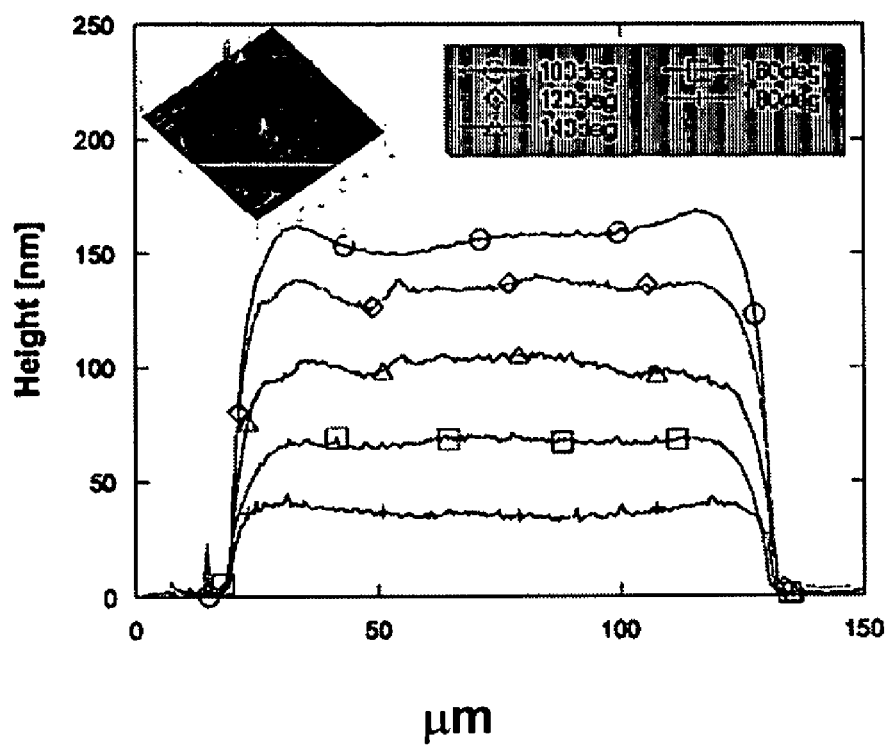
Fig. 29(c-5).

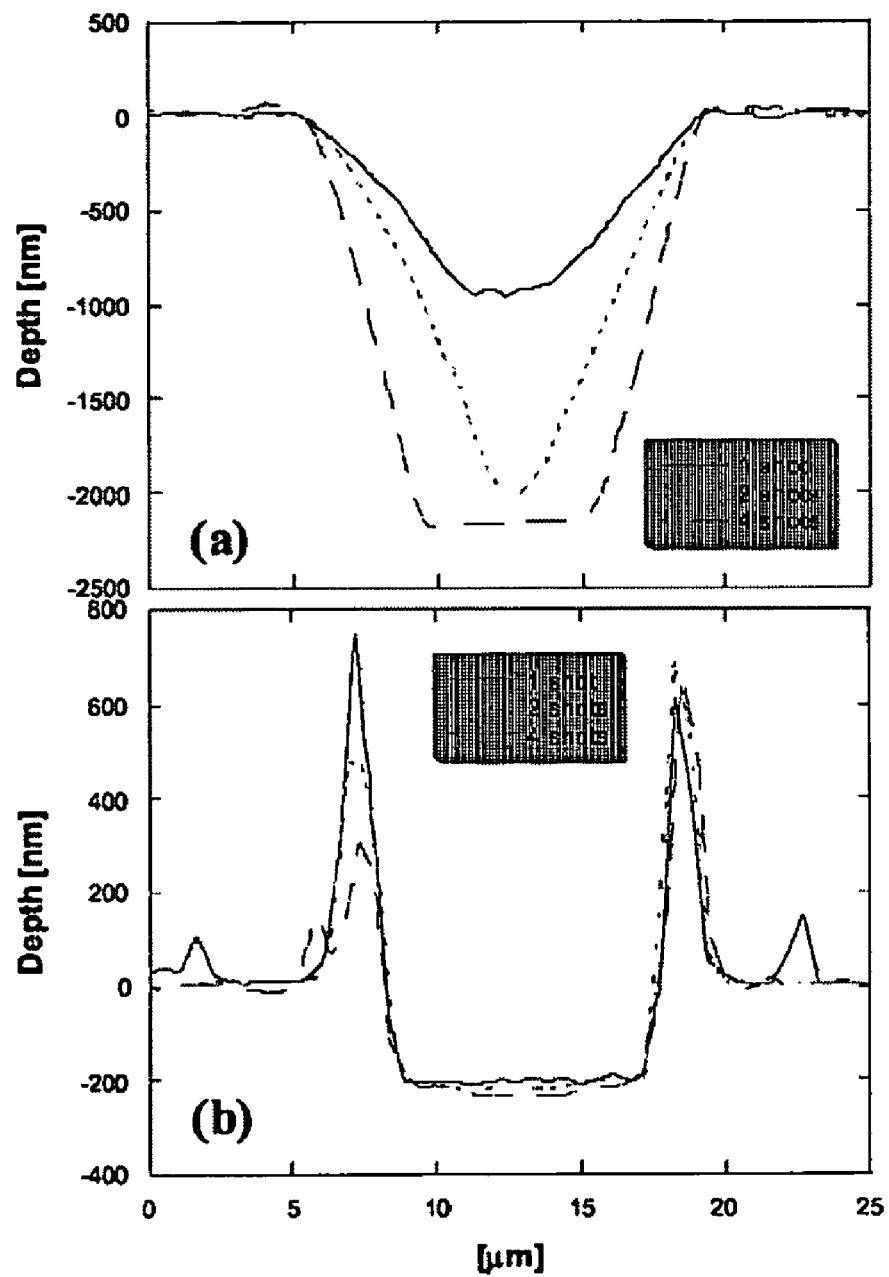
Fig. 30 (c-6).

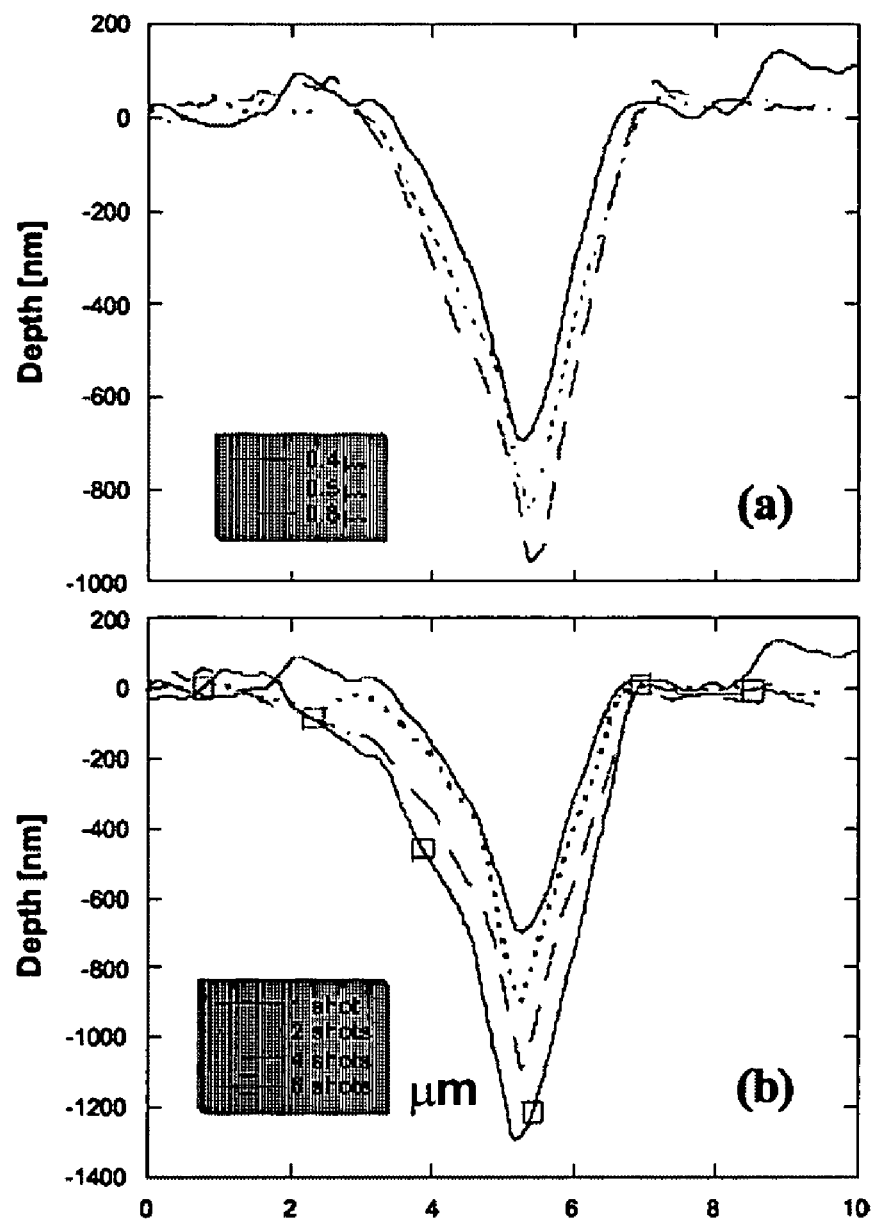
Fig. 31 (c-7).

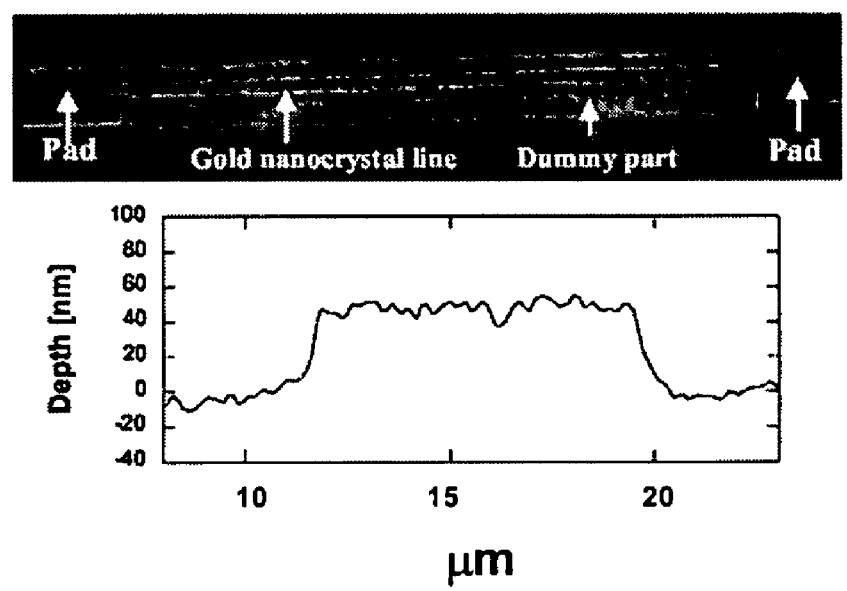
Fig. 32 (c-8).

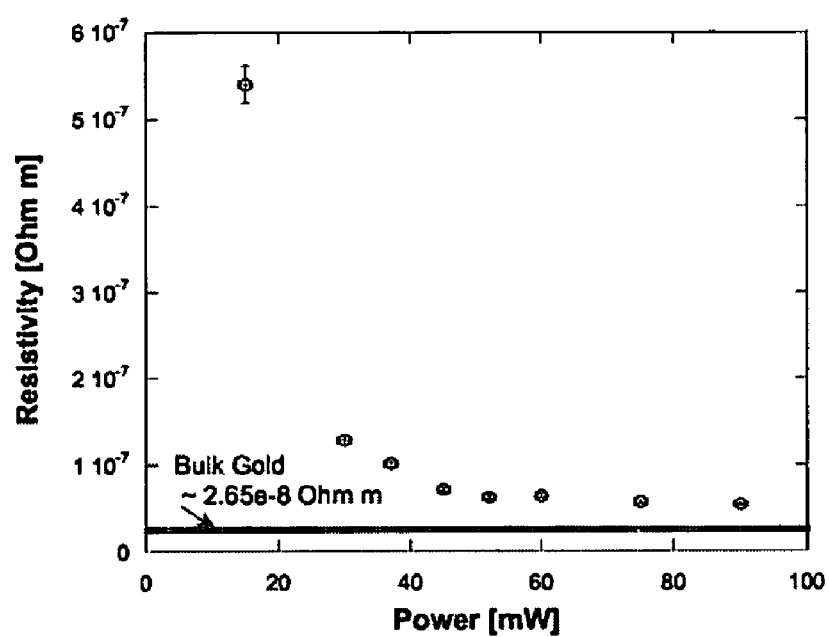
Fig. 33 (c-9).

MASKLESS NANOFABRICATION OF ELECTRONIC COMPONENTS

CROSS-REFERENCE TO RELATED APPLICATION

This application is a continuation-in-part of application Ser. No. 10/621,046, filed Jul. 16, 2003, the entire contents of which is incorporated herein by reference for all purposes.

STATEMENT REGARDING FEDERALLY SPONSORED RESEARCH OR DEVELOPMENT

This invention was made in part with Government support under Grant (contract) No. CTS-0417563 awarded by the National Science Foundation. The Government has certain rights to this invention.

BACKGROUND OF THE INVENTION

1. Field of Invention

This invention relates generally to the field of fabrication with nanoparticles and, more particularly, to the low temperature maskless fabrication of functional structures with nanoparticles and, most particularly, to the nanofabrication of passive and active electronic structures and devices.

2. Description of Prior Art

The development of direct printing of functional material has gained significant interest as an alternative to conventional integrated circuit (IC) processing, particularly for applications to low-cost flexible electronics. While conventional lithographic processes are well developed for the patterning of inorganic microelectronics, flexible polymer surfaces are often incompatible with typical photoresists, etchants and developers used in conventional IC processes.

In addition, other challenges exist in attempting to utilize conventional IC processing techniques to produce electronic components on flexible, typically polymeric, substrates. Conventional IC processes are typically multi-step processes that require high processing temperatures and generate toxic wastes which combine to add to the cost.

One approach to overcoming these problems is to employ drop-on-demand (DOD) inkjet printing. Since inkjet printing is an additive process, many of the problems encountered with conventional IC processing technologies can be overcome in a cost-effective manner. The fully data-driven and maskless nature of DOD inkjet printing typically allows increased processing versatility compared to other direct printing methods. The material is typically deposited on the surface along with a carrier solution, typically by means of a piezo-electrically driven micro-capillary tube, which provides enhanced processing flexibility for choosing both the material and the substrate. However, inkjet printing of electronic devices and structures utilizing nanoparticles has challenges of its own.

The term "nanoparticles" as used herein designates particles having a diameter less than approximately one micron (micron=1 μm=$10^{-6}$ meter), typically much less than one micron or well into the submicron range. It is known in the art that such particles exhibit thermophysical properties substantially different from those of the corresponding bulk materials. In particular, the melting point typically decreases substantially for particles having diameters below approximately 100 nm (nm=nanometer=$10^{-9}$ meter), and in particular below approximately 10 nm. For example, nanoparticles of gold having diameters of approximately 2.5 nm show a melting point of approximately 300° C. to 400° C., whereas the melting point of bulk gold is 1063° C. For economy of language, we refer to fabrication of structures and devices from nanoparticles as nanofabrication.

In WO 00/10197 this effect of depressed melting point is exploited for producing copper structures on a semiconductor wafer at low temperatures. A suspension of copper nanoparticles in a liquid is applied to a semiconductor chip. After evaporation of the solvent, the nanoparticles are concentrated in recesses in the wafer surface and the wafer is heated above the particles' melting point to sinter or melt them. This method takes advantage of the comparatively low melting point of the particles, but it requires the presence of suitable recesses in the surface of the substrate.

Published Japanese patent application JP2000014101 describes a method for forming structures by focusing a laser beam into a storage tank containing a suspension of superfine particles. This method requires a large amount of the suspension and is therefore expensive.

Szezech et al in *IEEE Transactions on Electronics Packaging Manufacturing*, Vol. 25, No. 1, pp. 26-33 (2002) have constructed fine conductor lines by drop-on-demand jet printing of nanoparticles suspended in solution followed by evaporation and sintering of the structure by inserting the entire structure into an oven maintained at moderate temperature (300° C.).

Thus, in view of the foregoing a need exists in the art for simple and efficient methods, materials and equipment for producing structures from nanoparticles without the need for recesses on the surface in which the particles collect, or for heating the entire substrate.

Additionally, since many substrates on which it would be desirable to fabricate passive and active electronic components are incompatible with the high temperatures, photoresists, etchants or developers typically employed in subtractive lithographic processes conventionally used to fabricate ICs, a further need exists in the art for systems, materials and methods that comprise additive processes for the production of ICs.

While inkjet processes achieves certain advantages as noted above, typical inkjet processes have the disadvantage of having coarser resolution than that achievable with conventional IC processing. The resolution of inkjet processing is governed chiefly by the nozzle diameter, typically about the same as the droplet diameter, and the variation of the droplet flight to the substrate, and the droplet spreading on the substrate. Thus, a further need exists in the art to achieve inkjet fabrication of electronic structures and/or devices with improved resolution.

SUMMARY OF THE INVENTION

Hence, it is a general object of the present invention to provide devices, materials, and/or methods for fabricating structures using nanoparticles and to provide improved structures.

Now, in order to implement this and still further objects of the present invention, which will become more readily apparent as the description proceeds, the method for producing a structure on a substrate comprises in some embodiments the steps of depositing drops of a suspension of nanoparticles of a material in a liquid by means of a droplet generator, melting or sintering the nanoparticles of the deposited drops at least partially, typically by exposing to laser light pursuant to some embodiments of the present invention, and solidifying or agglomerating the molten/sintered nanoparticles for forming the structure.

Accordingly, in some embodiments, the nanoparticles are applied in drops of a suspension to the substrate using a droplet generator, which reduces the amount of suspension required. The particles are molten or sintered at least in part by exposing to a localized source of heating, typically laser light, whereupon they are solidified, thus forming a solid structure in those places where the nanoparticles were heated by the laser. This provides an efficient, low-loss method for forming a structure on the substrate. Compared to the method of heating the nanoparticles on the substrate in an oven or on a hotplate, laser curing leads to local heating only, so that damage to thermally sensitive regions in other areas of the substrate can be reduced or avoided. This is particularly important in the formation of conductive interconnections in integrated circuits in which thermal damage to other regions of the circuit may occur if heat applied to the nanoparticles is widely dispersed. In addition, the laser light is at least partially absorbed by the particles directly and not by the substrate, which also tends to reduce the temperature increase in the substrate or other structures in the vicinity of the deposited nanoparticles.

In addition, the use of laser ablation in some embodiments of the present invention permits the deposited structures to be more finely constructed than is typically achievable with droplet deposition of nanoparticles. That is, printing or droplet-based fabrication of structures is typically limited by the precision with which the droplets can be deposited, by the spreading of the droplets when brought into contact with the substrate, among other factors. The use of laser ablation pursuant to some embodiments of the present invention permits more precisely constructed structures to be fabricated as well as structures with dimensions typically smaller than that achievable with droplet-only fabrication techniques.

The laser light employed herein pursuant to some embodiments may have a non-Gaussian intensity distribution for improving the quality of the generated structure, or it may be pulsed for improved control of the heat flow into the substrate. Additionally, multiple laser beams may be combined to tailor the intensity distribution for improving the quality of the generated structure. The multiple laser beams may originate from different laser systems or may result from the splitting of one or more laser beams, or a combination of both.

In the present context, the term "Gaussian" intensity distribution is used to refer to any intensity distribution that is generated by a single Gaussian beam intersecting a plane, i.e., by a beam having an intensity substantially proportional to $\exp(-(r/R)^2)$, where r is the radial distance from the beam's central axis and R is a constant. The term "non-Gaussian" intensity distribution is used to refer to a type of intensity distribution substantially different from Gaussian, for example, such as the intensity distribution generated by a beam sent through a mask or by a combination of multiple Gaussian or non-Gaussian beams.

Another aspect of some embodiments of the present invention relates to the steps of depositing drops of a suspension of nanoparticles of a material in a liquid onto a substrate, illuminating a curing point on the substrate by laser light, at least partially melting the nanoparticles of the deposited drops at or near the curing point and solidifying the molten nanoparticles for forming the structure.

Another aspect of some embodiments of the present invention, relates to the steps of depositing a layer of a suspension of nanoparticles of a material in a liquid onto a substrate, illuminating a curing point on the substrate by laser light, typically having a non-Gaussian intensity distribution, and at least partially melting the nanoparticles of the deposited drops at or near the curing point while simultaneously moving the substrate with respect to the curing point to form a line, strip or other desired pattern of material.

The average diameters of the nanoparticles employed pursuant to some embodiments of the present invention are advantageously chosen to be sufficiently small such that the melting point of the nanoparticles is reduced substantially below the bulk melting point. For most materials of practical interest, the average diameter is typically chosen to be less than approximately 100 nm, in particular less than approximately 10 nm, and advantageously between approximately 1 nm and 5 nm. The nanoparticles can be of any material suited for sintering or (at least partial) melting upon laser irradiation. In particular, they can be of a metal, such as gold, copper, silver, aluminum, and the like although other sinterable materials, such as ceramics, are also included.

A further aspect of some embodiments of the present invention relates to the structures produced by the methods, materials and systems described herein.

Some embodiments of the present invention relate to a device for producing a structure on a substrate comprising a droplet generator for producing drops of a suspension of nanoparticles of a material in a liquid, the droplet generator adapted for directing droplets onto a substrate, and a laser source with imaging means adapted for being directed to said substrate.

The substrate can be a pre-existing surface or a structure, for example a polymer structure, created by using the same printing technology as for manufacturing the nanoparticle structure and cured with standard ultraviolet (UV) radiation or a laser polymerization method, before the nanoparticle structure is deposited upon it.

These and other advantages are achieved in accordance with various embodiments of the present invention as described in detail herein.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not to scale.

The figures herein are numbered sequentially and some figures also carry a secondary designation, a-1 through a-8, b-1 through b-7 and c-1 through c-9. These secondary designations are used in Examples A, B and C.

Figure 1:
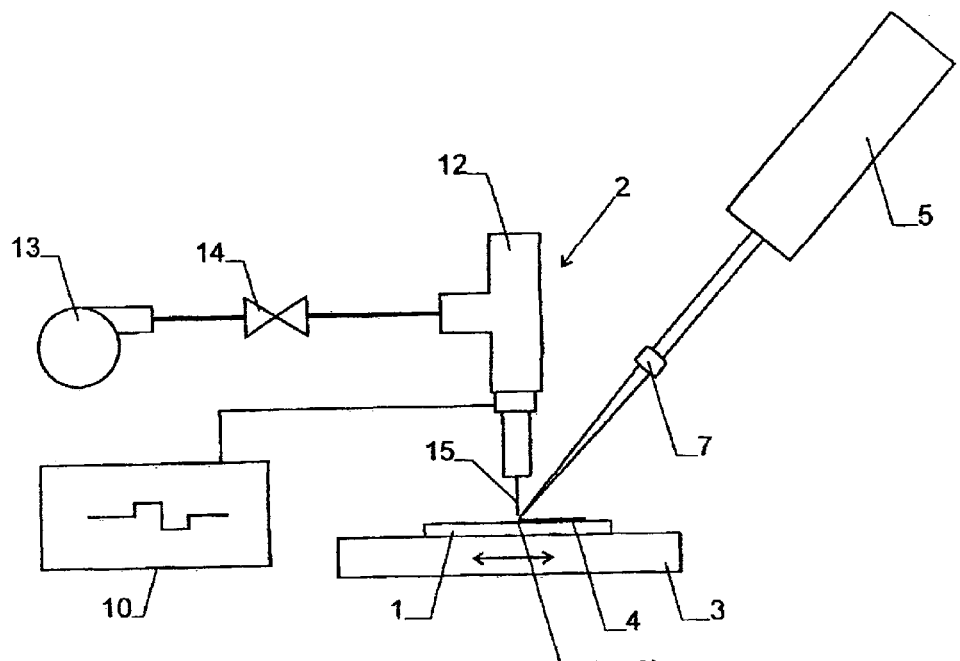

The techniques of the present invention can readily be understood by considering the following detailed description in conjunction with the accompanying drawings, in which:

FIG. 1 is a schematic representation of a system for practicing the methods of some embodiments of the present invention.

Figure 2:
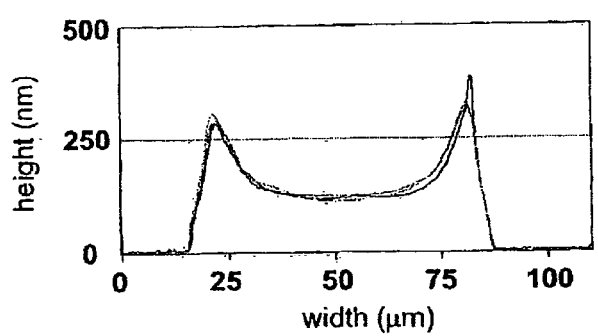

FIG. 2 is a graphical depiction of a thickness profile of a line strip cured with a single Gaussian laser beam at 100 mW (milliwatt) and a speed of 0.2 mm/s (mm=millimeter, s=second).

Figure 3:
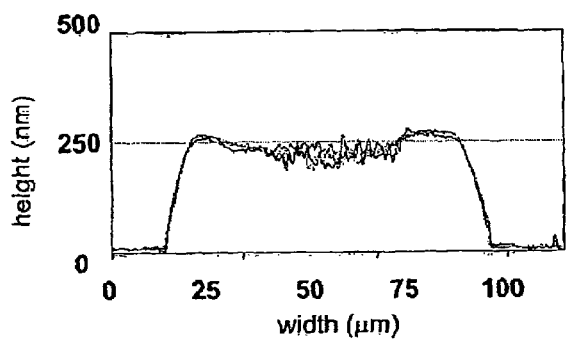

FIG. 3 is a graphical depiction of a thickness profile of a line strip cured with a single Gaussian laser beam at 300 mW and 0.2 mm/s.

Figure 4:
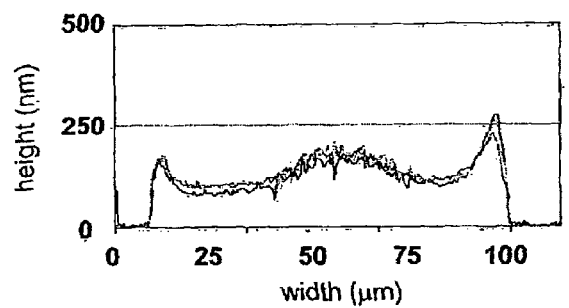

FIG. 4 is a graphical depiction of a thickness profile of a line strip cured with a single Gaussian laser beam at 500 mW and 10 mm/s.

Figure 5:
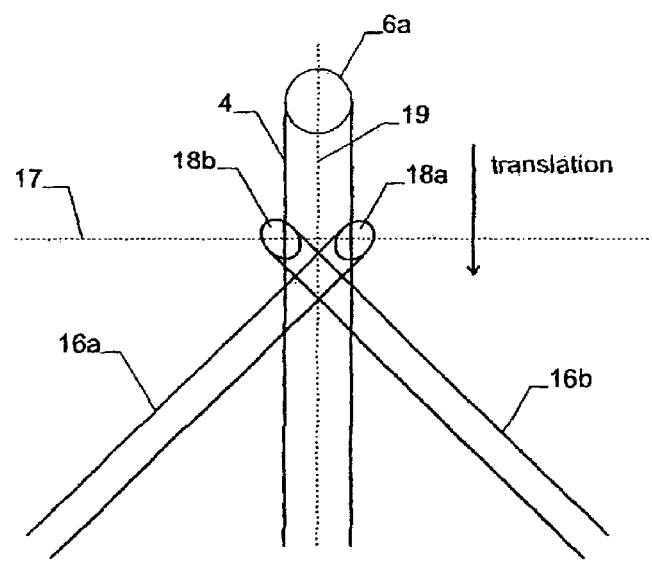

FIG. 5 is a schematic top view of a curing set-up advantageously employed with some embodiments of the present invention.

Figure 6:
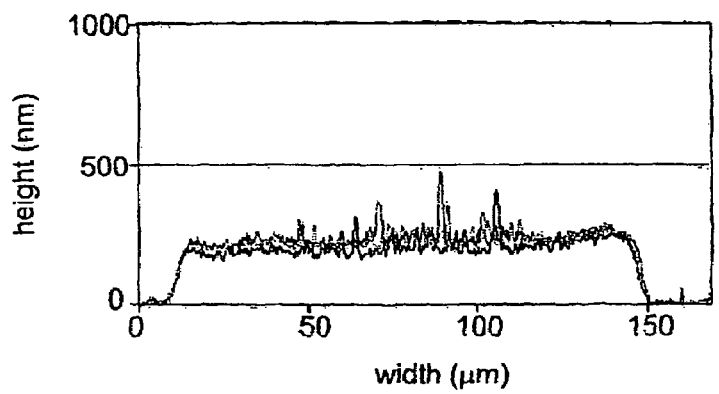

FIG. 6 is a graphical depiction of the thickness profile of a line strip cured with a double Gaussian laser beam (heart shaped) at 2×603 mW and 0.5 mm/s.

Figure 7:
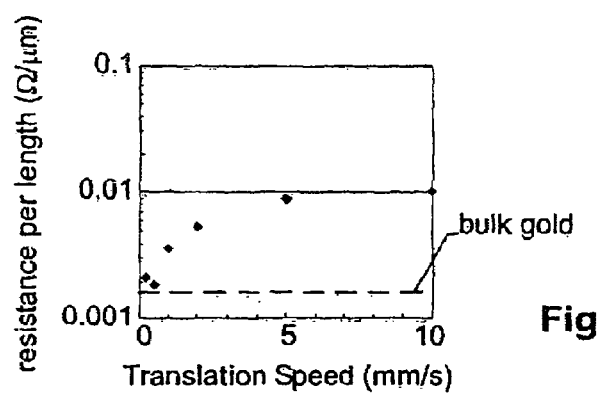

FIG. 7 is a graphical depiction of the resistivity of a cured line strip as a function of translation speed during curing with double Gaussian laser beams (heart shaped) at 2×603 mW.

Figure 8:
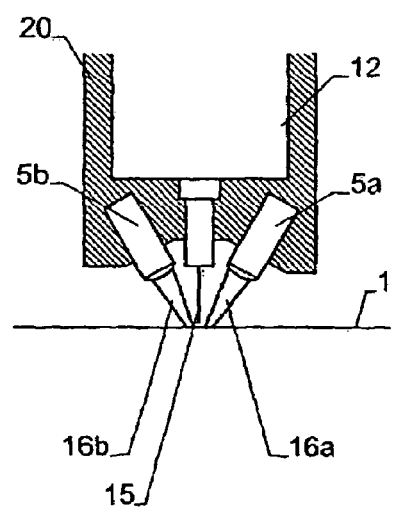

FIG. 8 is schematic partially sectional view of a printing head with integrated curing light sources.

Figure 9:
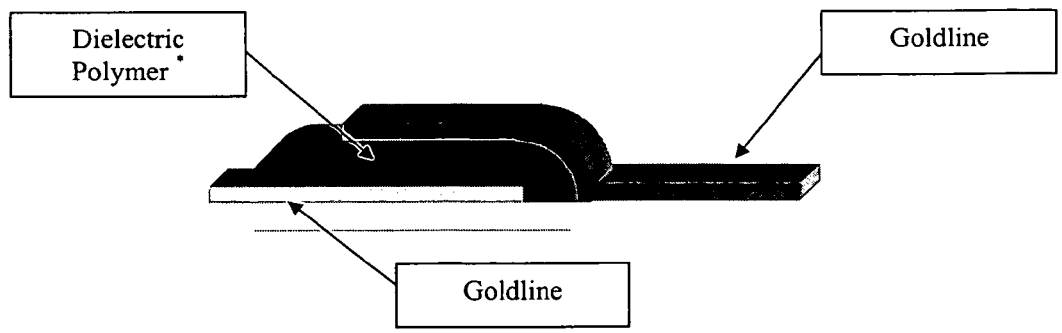
Figure 9:
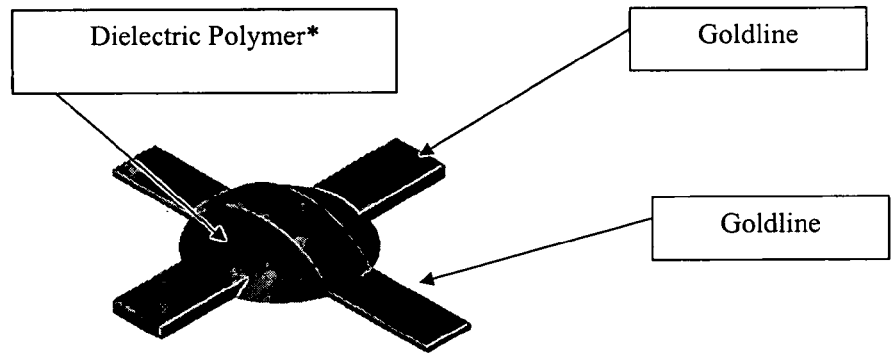

FIG. 9 is a schematic view of typical electronic components fabricated pursuant to some embodiments of the present invention.

FIG. 10(a-1) is a schematic representation of a system for practicing methods of some embodiments of the present invention.

FIG. 11 (a-4) is a depiction of a crossover capacitor manufactured using some embodiments of the present invention.

FIG. 12 (a-2) depicts resistivity test structures inkjetted and ablated by Nd:YAG laser at 1.2 µJ (micro Joules) with 20× objective lens for various widths (20 µm (a,b), 40 µm (c,d,e, f)). After inkjetting and ablating, the sample was sintered by Ar ion laser at various powers (75 mW (b,d), 110 mW (f)). (a,c,e) are before sintering and (b, d, f) are after sintering.

FIG. 13 (a-3) is a graphical depiction of resistivity calculated from resistance measurement and AFM scanned cross-sectional area including data from various Ar ion laser irradiation powers. The bottom solid line represents the bulk resistivity of gold.

FIG. 14 (a-5) depicts AFM scanned cross sections of inkjet printed PVP layer for various scanning speeds (a-d) and for multiple numbers of scans (d-f). The images are 250 nm high and 170 µm wide.

FIG. 15 (a-6) depicts pulsed laser ablation of multi-layered structure. PVP layer is sandwiched between lower and upper line. Lower line is laser sintered, however upper line was not sintered before laser ablation. Channel is 7 µm in width.

FIG. 16 (a-7) depicts (a) micrograph of inkjet printed top gate organic field effect transistor (OFET) layer on top polymer substrate, and (b), (c) schematic depictions of the FET structure in top view (b) and cross-sectional view (c).

FIG. 17 (a-8) is a graphical depiction of output (a) and transfer characteristics (b) of printed OFET with a channel length of 7 µm and width of 280 µm.

FIG. 18 (b-1) is a schematic depiction of an experimental setup.

FIG. 19 (b-2) is a schematic depiction of a multilayer structure.

FIG. 20 (b-3) is a shear force microscopy image of a gold track.

FIG. 21 (b-4) is an optical microscopy picture of a multilayer structure.

FIG. 22 (b-5) is a schematic electric circuit diagram.

FIG. 23 (b-6) is an optical microscopy picture of a functioning diode.

FIG. 24 (b-7) depicts wire bond to a gold pad on a glass substrate.

FIG. 25 (c-1) is a schematic depiction of a nanoink printing and curing system.

FIG. 26 (c-2) is a schematic depiction of a nanosecond laser ablation system.

FIG. 27 (c-3) is a schematic depiction of an Ar ion continuous laser sintering system.

FIG. 28 (c-4) are AFM scanned images of ablation profiles by single shot irradiation with 20× objective lens at various energies on samples prepared at (a) 120° C. (before sintering) and (b) 160° C. (after sintering). Both inset figures are surface morphology AFM images at 3 µJ of incident laser energy.

FIG. 29 (c-5) are AFM scanned images of one drop of gold nanoink profiled as the temperature increases.

FIG. 30 (c-6) are AFM scanned images of ablation profiles by multi-shot irradiation (1.2 µJ) with 20× objective lens on sample prepared at (a) 120° C. (before sintering) and (b) 160° C. (after sintering).

FIG. 31 (c-7) are AFM cross sectional profiles of ablation profile with 100× objective lens on sample prepared at 120° C. (before sintering) (a) single shot result. (b) multi shot result with 0.4 µJ of incident laser energy.

FIG. 32 (c-8) depict a resistivity test structure prepared by Nd:YAG laser ablation at 1.2 µJ with 20× objective lens. After ablation, central part connecting two pads is sintered by Ar ion laser at various powers. Lower figure shows AFM-scanned cross-section after ablation and sintering.

FIG. 33 (c-9) depicts resistivity calculated from resistance measurement and AFM-scanned cross-sectional area data at various Ar ion laser irradiation powers. Bottom solid line represents bulk resistivity of bulk gold.

DETAILED DESCRIPTION OF THE INVENTION

After considering the following description, those skilled in the art will clearly realize that the teachings of the invention can be readily utilized in the fabrication of structures from nanoparticles, in particular passive and active electronic components.

Additional information is given in the following references A-F, the entire contents of which are incorporated herein by reference for all purposes and made a part hereof.

A. "Subtractive Laser Processing of Low Temperature Inkjet Printed Micro Electric Components of Functional Nano-Ink for Flexible Electronics" by Seung Hwan Ko, Jaewon Chung, Yeonho Choi, David J. Hwang, Costas P. Grigoropoulos and Dimos Poulikakos, *Proceedings of IPACK 2005*, ASME InterPACK '05, Jul. 17-22, 2005, San Francisco, Calif.

B. "Multilayer Direct-Wiring of Electrical Conductors with Gold Nanoinks Using the Fountain-Pen Principle" by Cedric P. R. Dockendorf, Tae-Youl Choi, Dimos Poulikakos and C. P. Grigoropoulos, *Proceedings of IPACK 2005*, ASME InterPACK '05, Jul. 17-22, 2005, San Francisco, Calif.

C. "Fabrication of Inkjet Printed Flexible Electronics by Low Temperature Subtractive Laser Processing" by Seung Hwan Ko, Jaewon Chung, Yeonho Choi, Costas P. Grigoropoulos and Dimos Poulikakos, *Proceedings of IMECE 2005*, 2005 ASME International Mechanical Engineering Congress and Exposition, Nov. 5-11, 2005, Orlando, Fla., IMECE 2005-80535.

D. "Fabrication of Multilayer Passive Electric Components Using Inkjet Printing and Low Temperature Laser Processing on Polymer" by Seung Hwan Ko, Jaewon Chung, Heng Pan, Costas P. Grigoropoulos and Dimos Poulikakos, *SPIE Photonics West*, San Jose, Calif., Jan. 21-26, 2006.

E. "Fabrication of Multilayer Passive and Active Electric Components on Polymer using Inkjet Printing and Low Temperature Laser Processing" by Seung Hwan Ko, Jaewon Chung, Heng Pan, Costas P. Grigoropoulos and Dimos Poulikakos, *Sensors and Actuators A*, February 2006.

F. "Damage-Free Low Temperature Pulsed Laser Printing of Gold Nanoinks On Polymers" by Jaewon Chung, Seunghwan Ko, Costas P. Grigoropoulos, Niocole R. Bieri, Cedric Dockendorf and Dimos Poulikakos, *Journal of Heat Transfer*, Transactions of the ASME, Vol. 127, pp. 724-732, July 2005.

FIG. 1 shows a schematic representation of a typical apparatus for generating a structure from nanoparticles on a substrate, 1, which can be a semiconductor wafer or other material, for example, silicon, glass, polymer, among other insulating and/or semiconducting materials. Nanofabrication pursuant to some embodiments of the present invention is not limited to the fabrication of structures and devices on a substrate of a single composition, but also encompasses nanofabrication on substrates of varied compositions. Examples include polymers of various compositions and/or blends, semiconductor and/or insulators having various compositions, among other materials. Additionally, nanofabrication pursuant to some embodiments of the present invention can also be performed on inhomogeneous substrates having different compositions and/or structures in different regions thereof, as well as on substrates on which pre-existing structures are found.

A droplet generator, 2, is provided for generating a controlled, directed series of drops of a solid in liquid suspension directed onto a drop-off point, 6a, on substrate, 1. In some embodiments, the suspension comprises gold particles in an organic solvent. Typically, the drops are deposited on substrate, 1, to form a printed line, 4, as a layer thereon.

It is advantageous in some embodiments of the present invention for a directed energy beam to be focused on a curing point 6a. A beam of laser radiation is advantageously and conveniently used for this purpose, but is not the only source of directed energy. Electron or other particle beams, focused beams of electromagnetic radiation (non-laser) can also be directed to curing point 6a within the scope and intent of the present invention. However, for economy of language we indicate that a laser is the preferred source of energy.

Precise terminology typically uses "curing" to refer generally to the solidification of polymers and the like in which some form of chemical cross-linking or chemical change leading to solidification and/or agglomeration and/or increased viscosity occurs. While "sintering" typically refers to the agglomeration of powders—an effect related to the modification of the surface contacting properties of the particles. However, actual usage in the field has not been so precise and has used both curing and sintering to refer to agglomeration of particles (typically nanoparticles herein), a usage we follow. In the context of specific cases described herein, no confusion occurs whether agglomeration of particles or the curing of a polymer is intended.

The beam of a laser, 5, is typically focused at a curing point, 6a, on printed line, 4, using suitable focusing optics, 7. The radiation energy of the laser light is typically absorbed by the nanoparticles, leading to a temperature increase. "Sintering" is conventionally used to mean the formation of objects from a powder by heating the power material until the particles adhere to each other, which may occur at temperatures below the melting point of the powder. In some embodiments of the present invention, the temperature of the nanoparticles rises to a value above the melting point of the nanoparticles. In other embodiments, the temperature of the nanoparticles does not reach the particles' melting temperature but is nevertheless sufficient for sintering (and hence agglomeration) of the nanoparticles to occur. For economy of language, we refer to melting or sintering of the nanoparticles herein without distinction, understanding thereby that sufficient temperature has been achieved to cause agglomeration of the nanoparticles which may or may not involve actual melting (which would typically occur at temperatures well below the bulk melting temperature in any case.)

The heat at curing point 6a may evaporate the solvent and melt the nanoparticles at least partially. Typically, when the heated nanoparticles are moved away from curing point, 6b, they typically cool and solidify, resulting in a solid structure.

Typically, while drops are being deposited and laser, 5, sinters or melts the nanoparticles resulting in the formation of the solid structure, substrate, 1, may be moved with respect to laser, 5, and droplet generator, 2. For this purpose, in some embodiments substrate, 1, can be displaced by a positioning stage, 3, while laser, 5, and droplet generator, 2, remain stationary. In other embodiments it can be advantageous for the laser beam or other incident energy to be focused to various curing locations on a stationary substrate.

The position of drop-off point, 6a, where drops generated by droplet generator, 2, impinge on substrate, 1, may coincide with the position of curing point, 6b, which makes it possible to create a line strip, 4, along any direction. Alternatively, drop-off point, 6a, may be at a distance from curing point, 6b, in which case substrate, 1, is moved by positioning stage, 3, to move the liquid suspension deposited at drop-off point, 6a, to curing point, 6b.

Once line strip, 4, has solidified, any excess solvent and unsintered nanoparticles may be removed, if necessary, for example, by washing with a suitable solvent, heating, impinging a stream of air, nitrogen or other suitable gas, spinning, mechanical removal (inversion, vibration and the like), magnetic, electrostatic, or any other convenient means. Such post-deposition steps can frequently be rendered unnecessary by depositing a line-structure that is smaller that the curing point of the laser so that the solvent is typically evaporated in its entirety.

A pulse generator, 10, may be used for generating electrical pulses which drive the operation of droplet generator, 2.

In the following, some aspects of the procedure are described in more detail.

The nanoparticles are advantageously made of metal for forming a metallic structure, although metal-containing chemical compounds that deposit metal upon laser irradiation can also be used to form metal structures and are not excluded. Gold has been found to be an especially well-suited material. As mentioned above, nanoparticles of gold show a melting point of approximately 300 to 400° C. at a diameter of about 2.5 nm, which allows one to form the desired structure at moderate temperatures.

The liquid carrying the nanoparticles is more precisely named a "suspension fluid" and not "solvent" since the nanoparticles carried in the fluid are not in the form of single atoms or molecules (or an aggregate of a few atoms or molecules) as is properly the case for a species dissolved in a "solvent." However, conventional nomenclature in the field is often imprecise and we also use solvent or suspension fluid to indicate the liquid carrying the nanoparticles.

Toluene is one fluid advantageously used in connection with some embodiments of the present invention since toluene has good wetting properties on typical substrates and its viscosity is suited for generating small droplets. However, many other solvents can be used, aqueous, non-aqueous, organic, among others, that can be readily found with routine experimentation to provide adequate suspensions for the nanoparticles of interest, possess adequate wetting properties for the substrate(s) of interest, and adequate volatility under the processing conditions to be employed. Many specific examples of liquids advantageously used in connection with some embodiments of the present invention are provided in the examples included herein.

A suspension advantageously employed in connection with some embodiments of the present invention is gold in toluene, with the gold particles having diameters in the range of approximately 1 nm-5 nm, with approximately 30-35 weight percent or approximately 1.9-2.3 volume percent of gold respectively.

The nanoparticles can also consist of one or more non-metallic materials. In particular, some embodiments of the present invention allow the formation of ceramic structures. Superconducting ceramics are of particular interest, which can be sintered pursuant to processes in some embodiments of the present invention without creating the excessive thermal stresses that are widely considered to be responsible for the brittle behavior of many superconducting ceramics.

Droplet generator, 2, can be any device suited for the controlled generation of the drops. A drop-on-demand device is advantageously employed in which a volume of the suspension is compressed, typically by piezoelectric or thermal compression, thereby generating one or more drops of the suspension through an opening onto the substrate. Piezoelectric compression or any other isothermal mechanical or electromechanical compression is advantageous because it can be employed in connection with almost any suspension, while the heating required in thermal compression (bubble jet method) can lead to contamination or clogging. The latter can also be a viable candidate for printing if the above mentioned problems can be limited to the extent that they do not affect the process.

Droplet generator, 2, typically includes a reservoir, 12, for receiving the suspension to be printed. When using a suspension with low viscosity and low surface tension, for example a suspension based on toluene, a vacuum pump, 13, and a magnetic valve, 14, can be provided for maintaining decreased pressure in the reservoir to prevent undesired leaking.

In some embodiments, a demand mode droplet generator may be used to produce micro droplets of the suspension. For example, a piezoelectric droplet generator employed may include a glass capillary, 15, and a polarized piezoelectric crystal. Pulse generator, 10, can be used to generate bipolar pulse traces for an efficient droplet generation. A strobed light source and camera synchronized to pulse generator, 10, can be used to view the generated droplets.

The droplet generator can be used to deposit drops of a solution of gold nanoparticles suspended in a toluene solvent. The droplet generator can also be used to deposit drops of a solution of gold nanoparticles suspended in an alpha terineol solvent. The droplet generator can also be used to deposit drops of a solution of a polymer, including semiconducting polymers. Exemplary semiconducting polymers include modified polythiophene. The droplet generator can also be used to deposit drops of a solution of a polymer dielectric. An exemplary dielectric material is cross-linked PVP (poly-4-vinylphenol, molecular weight (MW) about 8,000 atomic mass units (AMU)) dissolved in PGMEA (propylene glycol monomethyl ether acetate) with a small amount of the cross-linking agent, poly(melamine-co-formaldehyde).

The parameters of the laser light at curing point, 6b, are typically selected with a view towards the properties of the nanoparticles as well as the desired heating rate and thermal distribution on the substrate.

The wavelength of the laser light is advantageously chosen to be in a region of high absorption of the suspension. The laser can be operated in continuous or pulsed mode.

In some embodiments, an argon ion laser operating at wavelengths of substantially 488 nm or 514 nm was used for gold suspensions because most of the radiation at these wavelengths is absorbed in the close vicinity of the printed free surface.

The diameter of curing point 6b is advantageously sufficiently small for forming even the finest parts of the desired structure and providing a light field with sufficient intensity. A typical diameter is less than approximately 500 μm, advantageously less than about 100 μm. A favorable $1/e^2$ beam waist for a Gaussian beam is about 27 μm.

Non-Gaussian intensity distributions and/or multi-beam geometries can also be used in some embodiments. Pulsed laser radiation can be used in some embodiments to reduce thermal stress.

EXAMPLE 1

In this example, gold nanoparticles with a mean average size of approximately 2 nm to 5 nm were suspended in toluene. The mass-fraction of gold in the solution was approximately 40% of the total weight. Droplets were generated with a drop-on-demand piezoelectric jetting device as described herein.

The drops, 3, were deposited to form a printed line strip, 4, on a silicon wafer substrate by moving the substrate continuously at a speed of about 1 mm/s (millimeter per second) with a positioning stage. Printed line strip, 4, was simultaneously cured by light from an argon ion laser at a wavelength of 488 nm, where the suspension had an absorption of less than 1 $\mu m^{-1}$. The curing point, 6b, was located immediately behind the point, 6a, where the drops impinged on the substrate, 1. The curing point had a diameter of approximately 100 μm.

After cooling, the remaining structure consisted of solid, continuous, electrically conducting gold lines with good electrical conductance. The lines had a typical width of approximately 60 μm-100 μm.

EXAMPLE 2

In this example, gold in toluene suspension with droplets of approximately 46 μm diameter were applied at a frequency of 30 Hz to a glass substrate moving at 2 mm/s. The width of the deposited (still liquid) line was measured to be about 125 μm.

After printing, a continuous cw-argon ion laser beam with wavelength 514 nm was applied for curing with a translation speed of 2 mm/s to the approximate center of the printed line at an angle of incidence of 45°. The laser beam had a power of 100 mW and the beam waist ($1/e^2$) was 27 μm.

Atomic Force Microscope (AFM) images were recorded for evaluating the cross section of the cured printed line. A thickness profile along three different lines perpendicular to the printed line are shown in FIG. 2. As observed, the cured line strip has a maximum thickness at its edges. The non-uniformity of the thickness is thought to be due to thermal diffusion of gold particles towards the edge of the beam, i.e., towards the evaporation interface line, as well as to a decreased surface tension at the center of the beam.

EXAMPLE 3

The same parameters as for example 2 were used, with the following exceptions: The translation speed was 0.2 mm/s and the laser power was 300 mW. The thickness profile recorded by AFM is shown in FIG. 3.

EXAMPLE 4

The same parameters as for example 2 were used, with the following exceptions: The translation speed was 10 mm/s and the laser power was 500 mW. The thickness profile recorded by AFM is shown in FIG. 4.

EXAMPLE 5

In order to obtain a more homogeneous thickness over the width of the line for a wider range of illumination parameters, a method using two laser beams was applied with the same suspension and droplet generation parameters as example 2. For this purpose, a beam splitter was used to create two laser beams 16a, 16b, from an argon ion laser, which were directed by mirrors to impinge on the edges of printed line strip, 4, as shown in FIG. 5. For this purpose, the laser beams, 16a, 16b, were brought into a common plane inclined at an angle of 45° in respect to substrate, 1, and intersecting the same in a line, 17, perpendicular to printed line strip, 4. The angle between the laser beams, 16a, 16b, as seen perpendicular to substrate, 1, was 90°.

The beam waist ($1/e^2$) of each laser beam, 16a, 16b, was 27.5 µm, the power of each beam was 603 mW. The distance between the centers of the spots, 18a, 18b, generated on substrate, 1, was 140 µm, the width of the liquid printed line strip, 4, was 125 µm.

FIG. 6 shows the thickness profile of the cured line strip for a translation speed of 0.5 mm/s. As it can be seen, the thickness is fairly flat over the whole strip.

It has been found that the cured line strips exhibit excellent conductivity for low translation speeds during curing, with a decrease in conductivity at increased translation speeds. As can be seen from FIG. 7, the conductivity for translation speeds below 1 mm/s is comparable to the one for bulk gold.

EXAMPLE 6

Other embodiments of the methods described herein can be used to manufacture polymeric structures.

Polymer jetting combined with the printing of metallic nanoparticle suspension makes it possible to extend electrical circuit printing into three dimensions. Crossings of conductors and multiple layers of conducting lines can be manufactured using similar techniques. An example of conductor crossing is depicted in FIG. 9B. An example of a capacitor fabricated with polymeric materials and conductors (typically gold) pursuant to some embodiments of the present invention is depicted in FIG. 9A. Other practical applications relate to fast and easy production of simple electronic components, perhaps "desktop" production. Another area of potential application is in wire-bonding, indeed today's multiple process task of interconnecting chips can be reduced into a single machine.

In some embodiments, Norland Products Optical Adhesive NOA 73, an epoxy, was used. Other possible materials include polystyrene, poly methyl methacrylate (PMMA), polyimides, and most photoresists, as well as adhesives, such as: Summers Optical #SK9, Norland Products #NOA-AY-96, Epoxy Technology #OG-125, and Epoxy Technology #OG-146. Another exemplary polymer dielectric material includes cross linked PVP (poly-4-vinylphenol) dissolved in PGMEA (propylene-glycol-monomethyl-ether-acetate).

NOA-73 was jetted onto a substrate using the droplet generator described above. In order to facilitate NOA-73 delivery by means of this droplet generator, it was heated above approximately 45° C. Temperatures above about 65° C. are disadvantageous as unwanted polymerization may take place. Good results were achieved at 55° C. Droplet size and jetting frequency depend on the desired shape of the line. Typical jetting parameters of the pulse applied to the droplet generator were: rise, final rise times about n10 µs, fall time about 20 µs, dwell time about 29 µs, and echo time about 58 µs, the amplitude being about 20 V with an idle voltage of about −15 V. The back pressure was set at 20 mbar (millibar).

The lines deposited in this manner were subsequently cured by UV light, with a maximum wavelength in the range of about 350 nm-380 nm. The recommended energy required for full curing is 4 J/cm$^2$ of long wavelength UV light, which can be achieved with irradiation from a UV lamp. UV lasers can, however, be used as well.

The techniques of this example permit (for example) the deposition of a structured polymer layer above or below a structure of sintered nanoparticles by depositing drops of a polymerizable liquid on the substrate or on the next lower structure, respectively, and polymerizing the drops of deposited polymerizable liquid, e.g., using UV radiation.

Polymer jet-deposition may not, in all cases, deposit the polymer in precisely the desired shape or thickness. For example, electrical properties, such as capacitance or resistance, may need to be adjusted following deposition. In addition, the upper surface of the deposited polymer may have an irregular shape, making it difficult to coat with continuous layers of electrical conductor. Some embodiments of the present invention include secondary processing of the polymer (typically laser processing) to improve its performance and/or properties, smooth and/or planarize its surface, and/or change its shape or thickness. Laser impact may remove polymeric material in desired locations to smooth the surface for advantageous deposition of gold lines and/or change the electrical characteristics.

However, laser impact may have undesirable side effects and cause the polymeric material to flow into a different geometry without material removal. In addition, laser impact may cause chemical, structural, and/or morphological changes of the polymer, any combination of which can alter the electrical or surface properties of the polymer. For example, a UV-curable polymer can be spin-coated on a substrate and selectively cured by a UV laser. Subsequent removal of the uncured portion leads to polymeric material on the substrate only where desired.

Secondary laser processing (if used) can conveniently be performed by a laser beam integrated with the particle deposition system. Such secondary laser processing can be carried out substantially concurrently with particle deposition, or very soon following deposition, as well as after formation of the structure on the substrate. In addition, the laser beam may have a tailored shape to facilitate reflow, material removal, or other polymer reshaping for desirable physical, electrical, or chemical properties.

As described herein, the profile of the printed line may be non-uniform as illustrated in FIG. 2. The gold nanoparticles tend to concentrate at the evaporation interface line under some conditions. Some methods to address this issue are discussed in Examples 3-5. Another method to influence the profile of the line is to heat the substrate. This increases the evaporation rate of the solvent and prevents a "splashing" profile when the droplet impacts the surface. It was found that heating the substrate to about 100° C. was advantageous. However, the temperature of the nozzle of the droplet generator may also increase due to heat transfer from the heated substrate. This increases the evaporation rate of the solvent within the nozzle and can lead to issues such as inconsistent flow, poor droplet control, clogging, and the like. Under these conditions, it was found to be advantageous to change the solvent to a higher boiling point solvent such as alpha-terpineol. This solvent has several benefits such as excellent clog resistance and a wider acceptable range of process parameters due to its higher viscosity (as compared to toluene). This method has at least one additional advantage. Since the line strips are being printed at an elevated substrate temperature, the removal of the solvent is more efficient. This results in a lower resistivity for the printed line strip. Sheet resistances as low as 23 mΩ/square have been obtained in 1 µm thick films.

The preceding discussion addresses the use of laser radiation for the sintering of deposited microconductor line strips. A subtractive process to remove some parts of the deposited line may also be achieved by ultrashort pulse laser ablation. Advantageously, the high points at the edges of the lines (as illustrated in FIG. 2) can be trimmed off and removed to yield a more uniform line thickness. Because both the influence of heat conduction within the material and screening of incident laser light are strongly diminished with picosecond pulses, and can be ignored for femtosecond pulses, material removal is localized and requires less energy.

EXAMPLE 7

In an exemplary embodiment, a gold nanoparticle suspension comprising 1 nm-3 nm gold particles (10% by weight) suspended in alpha-terpineol was used. The substrate was heated to 100° C. so that the nozzle temperature was maintained above 50° C. The alpha-terpineol is a solid at room temperature and must be heated for proper deposition. Microconductor line strips were printed on substrates comprising glass, polyimide (PI), and polyethylene terephthalate (PET) using the piezoelectric drop-on-demand system as described previously. The average line width was 70 µm-140 µm.

A femtosecond (fs) laser ($10^{-15}$ sec.) (83 fs full width half maximum (FWHM), 800 nm wavelength, 1 mJ maximum pulse energy) was used to irradiate the samples. Laser ablation was performed at pulse energy of 0.15 µJ and 100 to 1000 Hz without significant damage to the polymer substrate. The laser ablation method was used to define lines with widths ranging from 1.5 µm to 20 µm.

EXAMPLE 8

In an exemplary embodiment, a gold nanoparticle suspension comprising 1 nm-3 nm gold particles (10% by weight) suspended in alpha-terpineol was used. The substrate was heated to 100° C. so that the nozzle temperature was maintained above 50° C. Microconductor line strips were printed on substrates comprising polyimide (PI), and polyethylene terephthalate (PET) using the piezoelectric drop-on-demand system as described previously.

A ND:YAG laser (532 nm wavelength) was used to irradiate the samples. Laser ablation was performed with pulse times of 3 ns-5 ns and 15 Hz without significant damage to the polymer substrate. Long working distance objective lenses 20× (NA=0.42), 100× (NA=0.7)) were used to focus the laser beam down to the diffraction limit. The diffraction limited focal spot of the Gaussian beam was about D=2.29 µm (20×), and D=1.38 µm (100×) on a $1/e^2$ basis. The same objective lens was used for in-situ monitoring of the sample surface combined with a zoom lens, a charge coupled device (CCD) camera, and a white light source. The white light beam was combined with the laser beam by a dichroic mirror (DM). The energy of the pulsed laser was in the range of approximately 0.4 µJ-40 µJ for microconductor fabrication and the corresponding laser beam fluence was 10 J/cm-$10^3$ J/cm$^2$ (20×). For the finer adjustment of the beam energy, a half waveplate ($\lambda/2$) and a polarizing beamsplitter (PBS) were used, permitting only P polarized light through the PBS.

EXAMPLE 9

In this example, the construction of capacitor structures is described. Gold nanoparticles with an average size ranging between 1 nm and 3 nm were suspended in an alpha-terpineol solvent. The suspension was deposited on a flexible polyimide polymer substrate heated to 100° C. using the drop-on-demand method described previously to form the bottom electrode, or lower conductive line, of a crossover capacitor. After the deposition of the suspension, short pulsed laser radiation was used to define finer features as previously described. Nd:YAG nanosecond laser pulses with 3 ns-5 ns pulse width, 532 nm wavelength, and 15 Hz frequency were used. FIG. 10 is a schematic illustration of the system used for the micromachining of fine feature by laser ablation. Mitutoyo long working distance objective lenses (5× (NA=0.14, NA=numerical aperture), 20× (NA=0.42), 100× (NA=0.7)) were used to focus the laser beam down to the diffraction limit. The diffraction limited focal spot of the Gaussian beam was about D=6.88 µm (5×), D=2.29 µm (20×), and D=1.38 µm (100×) on a $1/e^2$ basis. The same objective lens was used for in-situ monitoring of the sample surface combined with a zoom lens, a charge coupled device (CCD) camera, and a white light source. The white light beam was combined with the laser beam by a dichroic mirror (DM). The energy of the pulsed laser was in the approximate range 0.4 µJ-40 µJ for microconductor fabrication and the corresponding laser beam fluence was about 10-$10^3$ J/cm$^2$ (20×). For the finer adjustment of the beam energy, a half waveplate ($\lambda/2$) and a polarizing beamsplitter (PBS) were used, permitting only P polarized light through the PBS.

For sintering the nanoparticle films, an argon ion laser beam ($\lambda$=514 nm) was directed at the center of the printed line with an angle of incidence of 45°. The substrate was placed on a translation stage and in-situ images were taken via a fixed microscope. A long working objective lens (20×) was used and a filter eliminated argon laser light reflected from the sintered gold line. Because of the angle of incidence of the laser beam, the shape of the focused laser spot was an ellipse. The focused beam waist ($1/e^2$) along the minor axis, that is, perpendicular to the printed line, was 27 µm and the beam waist along the major axis was 38 µm. The translation stage speed and the applied laser power were 0.1 mm/s and 5 to 100 mJ, respectively.

Alternatively, the ablated, gold microconductor lines could be sintered by heating the substrate to about 200° C. for 10 minutes. Typically, heating methods comprising heat guns, heated chucks, heat lamps, ovens, furnaces, and the like may be employed.

A dielectric layer was deposited over the laser ablated and sintered gold microconductors with the substrate held at room temperature. The dielectric material is cross linked PVP (poly-4-vinylphenol, molecular weight (MW) about 8,000 atomic mass units (AMU)) dissolved in PGMEA (propylene glycol monomethyl ether acetate) with a small amount of the cross-linking agent, poly(melamine-co-formaldehyde). The same piezoelectric drop-on-demand printing system used for the gold nanoparticle suspension deposition was employed for the polymer deposition. After the polymer dielectric deposition, the polymer was cross-linked by heating the substrate to 200° C. for 5 minutes. Typically, heating methods comprising heat guns, heated chucks, heat lamps, ovens, furnaces, and the like may be employed.

Finally, the top electrode or upper conductor line was deposited using the piezoelectric drop-on-demand method as previously described and sintered by heating the substrate to 200° C. for 10 minutes. Typically, heating methods comprising heat guns, heated chucks, heat lamps, ovens, furnaces, and the like may be employed.

It is advantageous for the nanoparticles forming the top and bottom capacitor electrodes to be conductive, typically metals. However, while conductive top and bottom electrodes are called for in functioning electrical capacitors, the nanoparticles need not be conductive when deposited onto the substrate. Substances that form metals or other conductive materials when exposed to sintering conditions may also be used, as well as substances that become conductive when subjected to various thermal, mechanical or chemical conditions following deposition onto the substrate (where such post-deposition conditions may be applied for the purpose of forming conductors, or conductor formation may occur as a by-product of other post-deposition processing steps). Indeed, other conductive nanostructures formed pursuant to some embodiments of the present invention may also be formed from non-conducting nanoparticles as described herein, although it is envisioned that deposition of conductive, typically metal, nanoparticles will be the most convenient method for forming conductive nanostructures on a substrate.

The dielectric layer is thus sandwiched between crossover microconductor lines. The overlapping capacitor area can be varied from about $10^4$ $\mu m^2$ to about $3 \times 10^4$ $\mu m^2$ by using the laser ablation method as previously described to define only the lower microconductor line while maintaining the upper microconductor line width at approximately 150 µm. This is illustrated schematically in FIG. 11. The capacitance was measured with an HP4285A precision LRC meter and the Cp-Rp measurement was done at 100 kHz and 1 V. The measured capacitance was found to be in the approximate range from about 1 pf to about 10 pF (pf=picofarads=$10^{-12}$ farads) for non-shorted capacitors. Since the dielectric constant of PVP was reported to be around 3, the sandwiched dielectric layer thickness could be calculated to be about 200 nm from the relation, $C = A \cdot \epsilon_0 \epsilon_r / t$ where C is capacitance in farads (F), A is the area of each plane electrode in $m^2$, $\epsilon_0$ is electrostatic permittivity of vacuum in F/m, $\epsilon_r$ dielectric constant of insulator, t is the separation between the electrodes in meters.

A subtractive process to remove some parts of the deposited line may also be achieved by laser ablation, advantageously with pulsed laser ablation. Advantageously, the high points at the edges of the lines (as illustrated in FIG. 2) can be trimmed off and removed to yield a more uniform line thickness. Because both the influence of heat conduction within the material and the screening of incident laser light are strongly diminished with picosecond pulses, and can be ignored for femtosecond pulses, material removal is localized and requires less energy. Thus, short laser pulses are advantageously employed.

The laser ablation method may be employed either before or after the sintering of the nanoparticles. It was found that the unsintered material had a lower ablation threshold than the sintered material. Possible explanations for this observation relate to the relatively poor conductive heat transfer across the unsintered nanoparticles and the smaller reflectivity of the dried (but not sintered) nanoparticles as compared to the more reflective sintered nanoparticles. Additionally, it was found that the unsintered material could undergo explosive evaporation upon laser irradiation, apparently due to residual solvent trapped in the film. The difference in the ablation threshold between sintered and unsintered material may be exploited to effect the selective ablation of multilayers. For economy of language, this method will be termed "Selective Pulsed Laser Ablation by Differential Ablation Threshold" (SPLA-DAT).

In principle, selective ablation of multilayers can be done by placing the laser focal point exactly on the target layer, expecting that the underlying layer would be outside the depth of focus, and thus subjected to reduced irradiation intensity and be below the ablation threshold. However, this approach would be difficult since the target layer thickness is of the order of several tens of nanometers and the intermediate layer thickness is also very small. Consequently, a very small depth of focus would be needed, proportional to the multilayer separation distance. A small depth of focus is difficult to control. Therefore, it is difficult to perform the ablation of each layer selectively without affecting the other layers, especially if the layers consist of the same material or if the interlayer is transparent.

However, the different (or differential) ablation thresholds between sintered and non-sintered nanoparticle suspensions may allow effective and robust multilayer processing.

EXAMPLE 10

In an exemplary embodiment, a gold nanoparticle suspension comprising of 1 nm-3 nm gold particles (10% by weight) suspended in alpha-terpineol was used. The substrate was heated to 100° C. so that the nozzle temperature was maintained above 50° C. Microconductor line strips were printed on substrates comprising glass, polyimide (PI), and polyethylene terephthalate (PET) using the piezoelectric drop-on-demand system as described previously.

The microconductor line may be sintered by heating with a laser or by heating the substrate as described previously. A dielectric layer may be deposited over the microconductor lines using any common deposition technique comprising drop-on-demand deposition, spin coating, spray coating, dip coating, and the like and cured to form an intermediate dielectric layer. Typically, heating methods comprising heat guns, heated chucks, heat lamps, ovens, furnaces, and the like may be employed to cure the dielectric material.

A second microconductor line may be printed on top of the dielectric layer and arranged so that it intersects the first microconductor line at approximately a right angle. This effectively forms a cross-over capacitor. SPLA-DAT may be used to trim and define the second, non-sintered, microconductor line without inflicting damage to the first microconductor line or the intermediate dielectric layer. After the trimming step, the second microconductor line may be sintered by heating with a laser or by heating the substrate as described previously. Typically, heating methods comprising heat guns, heated chucks, heat lamps, ovens, furnaces, and the like may be employed.

EXAMPLE A

Example A: Fabrication of Multilayer Passive and Active Electric Components on Polymer Using Inkjet Printing and Low Temperature Laser Processing The contents of all references cited in this Example A are incorporated herein by reference for all purposes.

A.1. Summary of Example A

An example of low temperature fabrication of passive (conductor, capacitor) and active (field effect transistor) electrical components on a flexible polymer substrate is described. A drop-on-demand (DOD) ink-jetting system is used to print gold nano-particles suspended in Alpha-Terpineol solvent, PVP (poly-4-vinylphenol) in PGMEA (propylene glycol monomethyl ether acetate) solvent, semiconductor polymer (modified polythiophene) in chloroform solution to fabricate passive and active electrical components on flexible polymer substrates. Short pulsed laser ablation is shown to be capable of producing finer electrical components and thereby to overcome the resolution limitation of inkjet deposition. A continuous argon ion laser is used to perform local irradiation to evaporate carrier solvent as well as to sinter gold nano-particles. In addition, a new selective ablation of multilayered gold nanoparticle film is described using a technique of "selective pulsed laser ablation by differential ablation threshold" (SPLA-DAT) for sintered and non-sintered gold nanoparticles. Also, selective ablation of multilayered film is used to define the narrow channel of a FET (field effect transistor) and semiconductor polymer solution deposited on top of the channel completes fabrication of an organic field effect transistor (OFET).

A.2. Introduction

The development of direct printing of functional material has gained significant interest as an alternative to conventional integrated circuit (IC) processes, especially in the area of low cost flexible electronics. Conventional lithographic processes are well developed for the patterning of inorganic microelectronics. However, flexible polymer substrates are often chemically incompatible with resists, etchants and developers used in conventional IC processes. Also, more practical limitations exist in conventional IC fabrication processes that are multi-step processes, typically involve high processing temperatures, toxic waste, and are often quite expensive. Since drop-on-demand (DOD) inkjet printing is an additive process, many of these and other problems can be alleviated in a cost-effective manner. The fully data driven and maskless nature of DOD inkjet processing allows more versatility than other direct printing methods. The material is deposited in a carrier solution on the substrate, typically by means of a piezoelectrically driven microcapillary tube. This solution processing provides enhanced flexibility for choosing both the depositing material and the substrate.

The inkjet process can typically achieve one or more of these advantages but typically results in coarser resolution compared with IC process. The resolution of the inkjet process is mainly governed by the nozzle diameter (which is approximately the same as the droplet diameter), the statistical variation of the droplet flight, and droplet spreading on the substrate. The currently achievable minimum feature size is approximately in the range 50 $\mu m$-100 $\mu m$ ($\mu m$=micron=$10^{-6}$ meter). Hybrid inkjet printing methods are being developed to overcome the resolution of current DOD inkjet processing that can be configured either in a pre-process or a post-process sequence. For example, Sirringhaus et al [ref. a-1] applied a surface energy patterning technique and demonstrated all-polymer transistors with minimum 5 $\mu m$ channel length. In this method, the high line edge resolution was obtained by spreading ink on the hydrophilic area pre-patterned by photolithography. As a post process, Chung et al [ref. a-5] irradiated a laser locally to fabricate highly conducting micro lines on polymer substrate. Dockendorf et al [ref. a-9] and Ko et al [ref. a-10, ref. a-11] demonstrated interconnectors and multilayers based on gold nanoparticle laser sintering. As a subtractive post process, Ko et al [ref. a-7, ref. a-8, ref. a-10, ref. a-11] demonstrated that short laser pulses can ablate nanoparticle film to define small features without substantial damage to the polymer substrate by a process termed "NALSA (nanomaterial assisted laser sintering and ablation)". Since the laser-based hybrid printing is a data driven process (i.e., does not require masks such as required with typical surface patterning techniques), it is typically more compatible with direct inkjet printing. Ko et al [ref. a-11] describe a novel method for multilayer processing by SPLA-DAT (selective pulsed laser ablation by differential ablation threshold) and demonstrate selective ablation of a gold multilayer separated by 500 nm dielectric layer (nm=nanometer) without significantly damaging the underlying layer. These results suggest that SPLA-DAT can be used to fabricate FETs (field effect transistor) with high resolution and thereby overcome the afore-mentioned limitation of conventional all-inkjet-printed FET.

In this Example A, passive electrical components (capacitors and conductor lines) and active electrical components (FETs) are printed on polyimide substrate and new techniques for selective ablation for multilayer are described and demonstrated. Also, the fabrication of functional organic FETs (OFETs) with semiconductor polymer active layers are described.

A.3. Experimental Results

A.3.1 Experimental Set-Up

The electrodes for the passive and active electronic components were fabricated by sintering metal nanoparticles. The gold nanoparticles (in the approximate size range of about 1 nm to about 3 nm diameter) encapsulated by hexanethiol surface monolayer in an alpha terpineol solvent were inkjetted on polyimide film. Nanoparticles were used to exploit the significant depression of sintering temperature. Sintering is observed to occur in the temperature range of approximately 130° C. to approximately 140° C. This temperature range will be henceforth referred to as the "sintering initiating temperature," the determination of which is described in more detail elsewhere [ref. a-8]. This sintering initiating temperature is considerably less than the melting temperature of bulk gold (1063° C.), due chiefly to the thermodynamic size effect [ref. a-2] and the relatively low desorption temperature of the surface monolayer. The preparation of the gold nanoparticles and the drop-on-demand printing system have been described in detail elsewhere [ref. a-3-ref. a-8].

After the deposition of gold nanoparticle ink on a heated substrate at about 100° C. by the DOD inkjet printing, Nd:YAG laser pulses (having pulse width in the range of about 3 nm-5 nm, 532 nm wavelength ($\lambda$), 15 Hz frequency (f)) were used to irradiate the appropriate portions of the substrate to define finer features. Typically, most of the solvent had already vaporized when Nd:YAG laser pulses were applied, since the substrate was heated at about 100° C. during the printing process. FIG. a-1 shows the schematic of the micromachining workstation including the in-situ imaging setup for laser ablation. Mitutoyo long working distance objective lenses (5×  (NA=0.14), 20× (NA=0.42), 100× (NA=0.7)) were used to focus the laser beam down to the diffraction limit. The diffraction limited focal spot of the Gaussian beam was about D=6.88 $\mu m$ (5×), D=2.29 $\mu m$ (20×), D=1.38 $\mu m$ (100×) on $1/e^2$ basis. The same objective lens was used for in-situ monitoring of the sample surface combined with a zoom lens, a CCD camera and a white light source. The white light beam was combined with the laser beam by a dichroic mirror (DM). The energy of the pulsed laser was in the range from about 0.4 $\mu J$ (microjoule) to about 40 $\mu J$ for micro-conductor fabrication and the corresponding laser beam fluence was in the range from about 10 J/cm$^2$ to about 10$^3$ J/cm$^2$ (20×). For the finer adjustment of the beam energy, a half waveplate ($\lambda/2$) and a polarizing beamsplitter (PBS) were used.

For sintering nanoparticle films, an argon ion laser beam ($\lambda$=514 nm) irradiated the center of a printed line with 45° of incidence angle [ref. a-8]. The substrate was placed on a translation stage and in-situ images were taken via a fixed microscope. A long working objective lens (20×) was used and a filter eliminated reflected argon laser radiation from the sintered gold line. The focused beam waist ($1/e^2$) along the minor axis that is perpendicular to the printed line is about 27 μm and the beam waist along the major axis is about 38 μm. The translation stage speed and the applied laser power were about 0.1 mm/s (millimeter per second) and in the range from about 5 mJ (millijoule) to about 100 mJ, respectively.

A dielectric layer was deposited between the laser sintered and ablated gold micro lines. The dielectric material is cross linked PVP (poly-4-vinylphenol, MW~8,000 AMU [MW about 8,000 Atomic Mass Units) dissolved in PGMEA (propylene-glycol-monomethyl-ether-acetate) with a small amount of the cross-linking agent; poly(melamine-co-formaldehyde). The same piezoelectric drop-on-demand (DOD) printing system used for gold nanoparticle solution deposition was used. The jetting parameters and drop-to-drop spacing were carefully chosen. When the drop-to-drop spacing was excessive or too small, discontinuous lines were formed. At room temperature, the optimum drop-to-drop spacing was determined to be about 100 μm. A bigger diameter nozzle having a diameter about 60 μm was used to facilitate a more stable jetting process.

After printing PVP solution at room temperature, the substrate was heated up to about 100° C. for about 1 minute for solvent evaporation and then up to about 200° C. for about 5 minutes for cross linking of PVP.

An active layer of semiconductor polymer (modified polythiophene) was deposited on a laser-ablated channel. The semiconductor polymer was dissolved in chloroform and deposited at room temperature. After deposition, the semiconductor polymer was annealed at about 150° C. for about 30 minutes under nitrogen environment.

A.4. Results

A.4.1 Conductors

After the printing of gold nanoparticle ink on a heated polyimide film substrate at about 100° C. by the DOD inkjet system, Nd:YAG pulsed laser was used to ablate the nanoparticle film in order to produce finer features. The residual solvent, if any, and the hexanethiol surface monolayer are advantageously removed while the nanoparticles are sintered to form low resistivity conducting microstructures. Sintering can be done either by substrate heating or by continuous laser irradiation. In this example, argon ion laser heating was employed, since the heat-affected zone can be thus be kept small. This is often necessary for applications on polymer substrates with low transition/melting temperature.

Based on experiences with single- and multi-shot ablation experiments described elsewhere [ref. a-8], 1.2 μJ of energy was applied with the 20× objective lens to produce resistivity test samples. Test samples (FIG. a-2) about 1 mm long, about 40 nm high with various widths (typically in the range from about 10 μm to about 100 μm, about 20 μm for the samples depicted in FIG. a-2(a,b), and about 40 μm for the samples depicted in FIG. a-2(c,d,e,f)). They have 1 mm×0.1 mm pads at both ends for the resistance measurement probe contact. The remaining parts near the central narrow line are isolated dummy parts. The AFM (atomic force microscopy) cross-sectional profile [ref. a-8] (not shown here) shows a width of about 8 μm, a height of about 40 nm height line with sharp ablation edge, on a polyimide substrate. Note that most nanoparticles are often deposited at the edge of the droplet due to "ring stain problem" [ref. a-7]. This film non-uniformity is not desirable when another layer needs to be deposited on top. However, the central part shows very good uniformity. By trimming the outer high rim and utilizing only the relatively uniform central part, thin, narrow and uniform micro lines can be obtained.

Then, continuous argon ion laser ($\lambda$=514 nm) was used to irradiate and to sinter gold nanoink, forming conducting lines. The sintering process depends on the intensity of the incident laser and the laser scanning speed. Electrical resistivity ($\rho$) measurements were carried out to characterize the fabricated microconductors. FIG. a-2(a,c,e) depict the micrographs of the samples before continuous laser sintering and FIG. a-2(b,d,f) show micrograph images after continuous laser sintering for different laser powers (75 milliWatts (mW) FIG. a-2(b,d), 110 mW FIG. 2-(f)), respectively. After laser sintering, printed gold nanoparticle lines became bright, which indicates that the gold nanoparticles formed gold thin film. It was found that when the laser power exceeds about 100 mW, the polyimide substrates were damaged.

The electrical resistivity, $\rho$, is calculated from RxA/L. The resistance R was measured with a micro needle probe station. A is the cross sectional area of the gold line measured from AFM scanning data and L is the length of the test sample (about 1 mm here). Argon ion laser power was varied from about 15 mW to about 100 mW to study the resistivity change (FIG. a-3). Significant brightness change is observed starting from about 10 mW irradiated power. This corresponds to about 1.37 kW/cm$^2$ based on 27 μm beam waist ($1/e^2$). Polyimide film deformed significantly for power exceeding 100 mW (13.7 kW/cm$^2$). At low power, the sintering process was not complete and the resistivity was still high. As the power increases, the resistivity decreases. The resistivity decreases dramatically around 25 mW (3.43 kW/cm$^2$) and does not show great difference above 75 mW (10.3 kW/cm$^2$). The minimum measured resistivity (5.41 micro-ohm-centimeter (μΩcm)) obtained from laser sintering was almost two times higher than the bulk value (2.65 μΩ cm, solid line in FIG. a-3). This resistivity value difference could be explained by considering several factors. First, the gold film formed by laser sintering from gold nanoparticles is not perfectly crystalline metal but exhibits a polycrystalline structure. Therefore, the resistivity can be higher due to the boundary scattering. In addition, the resistance is greatly influenced by the film surface quality, since the gold film is very thin (about 40 nm). The RMS (root-mean-square) film surface roughness is about 5 nm according to AFM data. This can lead to enhanced carrier scattering and consequently increased resistance. The trapped residual hexanethiol inside the conductor may also be an important factor.

A.4.2 Capacitors

The above described micro-conductor lines were used to fabricate crossover capacitors (FIG. a-4). First, a lower level conductor line is ink-jet printed on polyimide film at about 100° C. and an accurate capacitor area was defined using Nd:YAG laser ablation. Then, the nanoparticle-laden line was sintered at about 200° C. for about 10 minutes. Afterwards, a PVP dielectric layer was ink-jet printed on top of the lower level conductor line at room temperature and then cross-linked at an elevated temperature (about 200° C.) for about 5 minutes. Finally, an upper level conductor line was ink-jet printed and then sintered again at about 200° C. for about 10 minutes to produce crossover micro-conductor lines. The dielectric layer is sandwiched between crossover micro-conductor lines. The overlapping capacitor area is varied from about 10$^4$ μm$^2$ to about 3×10$^4$ μm$^2$ by ablating only the lower line while the upper line width is maintained at about 150 μm. The capacitance was measured with an HP4285A precision LRC meter and the Cp-Rp measurement was done at 100 kHz and 1V. The measured capacitance was in the range of about 1 pF to about 10 pF (picofarad) for non-shorted capacitors. Since the dielectric constant of PVP is reported to be around 3, the sandwiched dielectric layer thickness could be calculated as around 200 nm from the relation, $C=A\epsilon_o\epsilon_r/t$ where C is the capacitance in farads (F), A is the area of each plane electrode in $m^2$, $\epsilon_0$ is the electrostatic permittivity of vacuum in F/m, $\epsilon_r$ is the dielectric constant of the insulator and t is the separation between the electrodes in meters. Note that this thickness could not be measured using AFM due to elevated rim structure.

We observed that both the inkjet printed dielectric lines and sintered gold nanoparticle electrode lines showed the ring stain problem. The uniformity and smoothness of both the electrode and the dielectric layer affect the isolation of the thin dielectric layer. A rough surface of the dielectric layer or electrode can result in shorted capacitors [ref. a-12, ref. a-13]. A thick dielectric layer could be a potential solution for working capacitors but a thick layer will increase the capacitance, which induces an increase in the turn-on voltage for a transistor. The problem of the thin electrode line apparently comes from the high rim structure. The high rim could be cut by laser ablation so that just the central uniform part can be used for electrodes. For the 200 nm-thick dielectric layer, the working capacitor fabrication yield was around 20% to 30%. However, it is expected that the yield could be increased to more than 50% by laser ablation of the high rim. The PVP in PGMEA solvent spreads and dries fast, thereby aggravating the ring stain formation. Most of the PVP material is deposited at the rim of the inkjet printed lines leaving the central part very thin. This elevated rim of the dielectric layer causes a stability concern for multilayered structure.

FIG. a-5 shows cross-sectional AFM images of inkjet printed PVP layer, employed here to study the effects of scanning speed and number of scan passes. Higher scanning speed (FIG. a-5(c,d)) typically exhibited milder ring stain formation and a broader uniform center. However, the thickness of the uniform center is still small (about 50 nm) and is subject to the shorted circuit problem. One possible solution is multiple layer printing (FIG. a-5(d-f)). However, this method was not successful since most of the material accumulated at the rims.

To evaluate the possibility of using printed and trimmed gold film by ablation for self-aligning dielectric film layer, the surface treatment was carried out as described in [Ref. a-11]. The highly localized processing nature renders the inkjet printing a more versatile deposition method. But localized processing is subject to alignment constraints. A sturdier dielectric layer printing process could be established by a series of organic material cleaning processes. This modification of surface characteristics facilitates self-alignment of the dielectric layer jetting and reduces the probability for partial dielectric layer coverage due to jetting instability and misalignment. It is anticipated that this procedure will increase the process yield.

4.4.3 Organic Field Effect Transistor (OFET)

4.4.3.1 Selective Ablation of Multilayer

Applying short-pulsed laser ablation for printed gold nanoink processing was demonstrated by Ko et al [ref. a-7, ref. a-8]. Laser ablation of gold nanoparticles before sintering not only showed a much cleaner ablation profile but also exhibited lower ablation threshold than the sintered gold film. This can be explained partly by the poor conductive heat transfer across the surface monolayer-protected nanoparticles, the smaller reflectivity of the just dried but still unsintered nanoparticles compared to the significantly more reflective sintered gold film, and the evaporation of surface monolayer and residual solvent that may still be trapped in the film. This ablation threshold difference can be used for the selective ablation of multilayer structures. In principle, selective ablation in multilayers can be done by placing the laser focal point exactly on the target layer, expecting that the underlying layer would be outside the depth of focus, thus irradiated by an intensity of laser light below the damage threshold. However, this approach would be difficult in practice since our target layer thickness is of the order of several tens of nanometers, and the intermittent dielectric layer thickness is also very small. Consequently, very small depth of focus would be needed, substantially proportional to the multilayer separation distance. Therefore, it is difficult in practice to ablate only the top layer selectively by adjusting the depth of focus position without affecting the underlying conductor layer. This is particularly true when the interlayer is transparent material and the separation between the conductor layers is submicron. In contrast, the differential ablation threshold between the laser sintered and non-sintered gold nanoink can allow effective and robust multilayer processing. FIG. a-6 shows successful selective multilayer processing with ink-jetted gold nanoink material. The basic structure is substantially the same with the crossover capacitor, except that the upper line is not sintered. A lower level line (printed in vertical direction) was inkjet printed and laser sintered to yield a brighter surface of high electrical conductivity line. Then, a PVP dielectric layer (printed in the horizontal direction) was inkjet printed and the upper level gold nanoparticle ink (printed in the horizontal direction) was printed on top of the PVP layer. Finally, pulsed laser irradiation was applied to selectively ablate the upper non-sintered gold nanoink line without inflicting damage to the lower level gold line. Subsequently, the upper gold nanoink line can be laser sintered to produce a conductor line. This technique can be used not only for fabricating multilayer structures but also for local processing of a single layer [ref. a-11].

4.4.3.2 Organic Field Effect Transistor (OFET)

Multilayer processing sequences incorporating the selective differential ablation described herein enables fabrication of more complex structures such as field effect transistors (FETs) with very high resolution. FETs with a small channel length are desirable in order to reduce the effective resistance and therefore increase drain current and speed due to less time for the carriers to cross the channel before recombination [ref. a-15]. Inkjet printed FET channels can be formed in several different ways. First, all-inkjet-printing method can be used. This method is very simple but the resolution (greater than about 50 μm) and quality is limited by the stability and accuracy of the jetting process. Besides, so called "ring stain effect" yields non-uniform film topography that often causes shorted circuits. Second, hybrid inkjet-printing process using surface energy patterning techniques can be used to obtain higher resolution (approximately in the range 1-30 μm). However, this method uses photolithography to change the local surface wetting characteristics, hence diminishes some of the advantages of direct writing techniques [ref. a-14].

In this example, high resolution all-inkjet-printed FETs were fabricated by using SPLA-DAT (selective pulsed laser ablation by differential ablation threshold), apparently for the first time. FIG. a-7 shows a micrograph (a) and schematics (b,c) of top gate OFET (organic field effect transistor) fabricated by SPLA-DAT. A significant new process is substantially the same as that used in connection with the previous multilayer selective ablation that was used to define the short channel (about 1-10 μm) without damaging underlying structure. One test sample has a channel length of about 7 μm and width of about 280 μm. Modified polythiophene in chloroform solution as semiconductor polymer was deposited on top of the channel to define the active layer of a top gate transistor. The OFET shows a typical accumulation mode p-channel transistor behavior. FIG. a-8 shows the output (a) and transfer characteristics (b) of the printed OFET measured using HP41 56B semiconductor parameter analyzer from 10 to −40V range. The measured value of carrier mobility was as high as 0.007 cm$^2$/V·s in saturation regime and 0.01 cm$^2$/V·s in the linear regime, while the on/off current ratio was around 5. The carrier mobility and drain current were sufficiently high, but the on/off current ratio was relatively small. The low on/off current apparently resulted from the non-optimized gate device gate configuration and high off-current by gate leakage current.

A.5. Conclusions

All-printed electronics is one key to the success of low-cost electronics such as all-printed RFID (radio frequency identification device) and large area displays [for example, see ref. a-12, and ref. a-13]. A drop-on-demand inkjet printing technique was used in this example to print micro conductors and capacitors. Surface monolayer protected gold nanocrystals were synthesized and deposited on polymer substrate in alpha-terpineol carrier solvent. Following deposition, low intensity nanosecond pulsed laser (Nd:YAG laser) was applied to easily ablate deposited nanoparticle material from the substrate in order to enhance the resolution of the ink jet printing method. Additionally, continuous Ar ion laser was applied to sinter nanoparticles to form low resistivity microstructures. PVP in PGMEA solution was inkjetted and cross-linked as dielectric layer to make a capacitor. Semiconductor polymer in chloroform solution was deposited and annealed as an active layer to make a transistor. Test features for resistivity measurement on polyimide film were prepared by pulsed laser ablation. Minimum resistivity of 5.4 µΩcm could be obtained without deformation of the polymer substrate. The fabricated low resistivity conductors can be used for inter-connectors for high quality flexible electronics. Crossover capacitors were made and their performance was characterized. The capacitance was in the range of about 1 pF to about 10 pF. The dielectric layer thickness was as small as about 200 nm without shorting. Capacitor shorting could be improved by laser ablation of high rim structure to produce a more uniform electrode surface. The alignment of the dielectric layer with the underlying gold line can be further enhanced by simple organic material cleaning processes.

To fabricate high resolution active electrical components, selective multilayer processing technique was demonstrated based on the novel method for multilayer processing SPLA-DAT (selective pulsed laser ablation by different ablation threshold) of the printed gold nanoparticle film before and after the sintering process. Finally, based on high quality microconductors, capacitor fabrication method and multilayer processing technique, short channels (about 1-10 µm) could be formed without damage to the underlying layers. OFETs with semiconductor polymer active layer were demonstrated by SPLA-DAT for the first time.

A.6. References a-1. J. Z. Wang, Z. H. Zheng, H. W. Li, W. T. S. Huck, H. Sirringhaus, 2004, "Dewetting of conducting polymer droplets on patterned surfaces", *Nature Materials*, 3, March (2004), pp. 171-176.

a-2. P. A. Buffat, J. P. Borel, "Size effect on the melting temperature of gold particles", *Phys. Rev. A.*, 13(6), (1976), pp. 2287-2298.

a-3. N. R. Bieri, J. Chung, S. E. Haferl, D. Poulikakos, C. P. Grigoropoulos, "Microstructuring by printing and laser curing of nanoparticle solutions", *Appl. Phys. Lett.*, 82(20), (2003), pp. 3529-3531.

a-4. J. Chung, S. Ko, N. R. Bieri, C. P. Grigoropoulos, D. Poulikakos, "Conductor microstructures by laser curing of printed gold nanoparticle ink", *Appl. Phys. Lett.*, 84(5), (2004), pp. 801-803.

a-5. J. Chung, S. Ko, C. P. Grigoropoulos, N. R. Bieri, C. Dockendorf, D. Poulikakos, "Damage-free low temperature pulsed laser printing of gold nanoinks on polymers", *ASME Journal of Heat Transfer*, Vol. 127, (2005), pp. 724-732.

a-6. J. Chung, N. R. Bieri, S. Ko, C. P. Grigoropoulos, D. Poulikakos, "In-tandem deposition and sintering of printed gold nanoparticle inks induced by continuous Gaussian laser irradiation", *Applied Physics A-Materials Science and Processing*, 79 (4-6), (2004), pp. 1259-1261.

a-7. S. Ko, J. Chung, T. Choi, C. P. Grigoropoulos, N. R. Bieri, T. Choi, C. Dockendorf, D. Poulikakos, "Laser based hybrid inkjet printing of nanoink for flexible electronics", *SPIE Photonics West*, San Jose, Calif., USA, Jan. 22-27, 2005.

a-8. S. Ko, J. Chung, Y. Choi, D. Hwang, C. P. Grigoropoulos, D. Poulikakos, 2005, "Subtractive Laser Processing of Low Temperature Inkjet Printed Micro Electric Components of Functional Nano-ink for Flexible Electronics", *Proc. of ASME IPACK*, San Francisco, Calif., USA, Jul. 17-22, 2005.

a-9. C. Dockendorf, T. Choi, C. P. Grigoropoulos, D. Poulikakos, "Multilayer Direct Writing of Electrical Conductors with Gold Nanoinks Using the Fountain-Pen Principle", *Proc. of ASME IPACK*, San Francisco, Calif., USA, Jul. 17-22, 2005.

a-10. S. Ko, J. Chung, H. Pan, C. P. Grigoropoulos, D. Poulikakos, "Fabrication of Inkjet Printed Flexible Electronics by Low Temperature Subtractive Laser Processing", *Proceedings of IMECE*, Orlando, Fla., USA, Nov. 5-10, 2005.

a-11. S. Ko, J. Chung, H. Pan, C. P. Grigoropoulos, D. Poulikakos, "Fabrication of Multilayer Passive Electric Components using Inkjet Printing and Low Temperature Laser Processing on Polymer", *SPIE Photonics West, San Jose, Calif., USA*, Jan. 21-26, 2006.

a-12. S. Molesa, D. Redinger, D. Huang, V. Subramanian, "High-quality inkjet-printed multilevel interconnects and inductive components on plastic for ultra-low-cost applications", *Mat. Res. Soc. Symp. Proc.*, Vol. 769, San Francisco, Calif., Apr. 21-25, 2003.

a-13. D. Redinger, S. Molesa, S. Yin, R. Farschi, V. Subramanian, 2004, "An Ink-Jet-Deposited passive component process for RFID", *IEEE Transactions on Electron Devices*, 51(12), (2004), pp. 1978-1983.

a-14. T. Kawase, S. Moriya, C. J. Newsome, T. Shimoda, "Inkjet printing of polymeric field-effect transistors and its applications", *Japanese Journal of Applied Physics Part 1*, 44(6A), (2005), pp. 3649-3658.

a-15. R. F. Pierret, 1996, "Semiconductor Device Fundamentals", *Addison Wesley*, New York, 1996, pp. 563-712.

EXAMPLE B

Example B: Multilayer Direct-Writing of Electrical Conductors with Gold Nanoinks Using the Fountain-Pen Principle The contents of all references cited in this Example B are incorporated herein by reference for all purposes.

B.1. Summary of Example B

Various studies have suggested the potential advantages of gold nanoparticle inks in microelectronic manufacturing. One advantage of using nanoparticles for the production of microelectronic conductors is their low melting point. Indeed the melting point of gold nanoparticles decreases dramatically with decreasing size. This interesting property presents us with an uncomplicated way in which to produce electronic conductors on plastics, and thus to manufacture flexible electronics. Microelectronic applications which make use of materials other than silicon make their appearance ever more often. In this example we describe and demonstrate a method of manufacturing multilayered electronic circuits using a scanning-probe-inspired technology to deposit and anneal a gold nanoink on various substrates. We also test some aspects of the quality of this technology by applying it to a complete electronic circuit.

B.2. Introduction

Significant effort has recently been placed into the development of inkjet technologies and related direct-write methods for electronic manufacturing. The overall trend in electronics is towards ever further miniaturization of components and reduction of costs. The need for novel manufacturing techniques in microelectronics is not only driven by the necessity for lower production costs, but also by the vast possibilities alternative methods can offer for high density electronics. Some of the advantages of the above mentioned techniques include their great flexibility, their possible application in online processes and their potential for out-of-clean room manufacturing.

Relatively high densities of electronic components can be achieved by the smaller pitch sizes that are already reachable with several direct write methods, such as scanning probe techniques. Another promising approach to high density technologies that can be explored simultaneously with pitch reduction is to build multilayered circuits, thus exploiting the third space dimension. Herein, we show a flexible sandwich chip produced with nanoparticle inks deposited using a "nanofountain pen". The chip consists of a gold pattern written on a polyimide substrate and a second polyimide layer printed on top of the first layer of gold tracks, on top of which a second gold pattern is then printed. The great potential of gold nanoparticles has been mentioned in several references. Bieri et al (ref. b-1) and Chung et al (ref. b-2) printed gold structures using inkjet technologies. Choi et al (ref. b-3) demonstrated the "fountain pen" principle for the writing of gold nanoparticles. Chung et al (ref. b-4) printed nanoinks, using inkjet on polymer substrates.

B.3. Experiments and Results

We used micropipettes pulled out of glass capillaries to deposit a gold nanoparticle suspension consisting of gold nanoparticles (GNP) sized between approximately 2 nm to 4 nm in a toluene solvent. In order to form a continuous electric conductor, the GNP can either be sintered using for example, laser light (ref. b-1 to ref. b-4), an oven, or by heating the sample on a hotplate. To underline the simplicity of this approach, we used a hotplate in this example. The polyimide was deposited in the same way as the GNP with micropipettes. The polyimide functions as an electrical insulator between the two conducting layers. A "tape test" was made successfully to test robustness of the structure. We thus manufactured a flexible multilayered structure consisting of a dielectric layer and conducting gold patterns by using a scanning-probe-inspired technology.

To deposit the gold tracks and the polyimide layer we used the same capillary tubes pulled into micropipettes in such a way that they can be utilized as a fountain pen. The setup used in this experiment has been described by Choi et al (ref. b-3). The capillaries are mounted onto a piezo-stack connected to a vertical translation stage. This allows for movement of the probe in z-direction as shown in FIG. b-1. The sample is placed onto a holder which is actuated in the x-y directions by two motors. Both the motors and the piezo-stack are computer controlled via a Labview program. Fine positioning adjustments until the gold nanoink wets the sample are made via the computer controlled piezo-stack. A 50× microscope objective allows for visualization of the wetting process through a hole in the sample holder. Visual control of the printing process is also possible through a 10× microscope objective from the top. Two CCD cameras transmit images from both objectives to the control PC. Micropipettes were produced in a reproducible way with a pipette-puller (DMZ Universal Puller, Zeitz Instruments). The pipette openings are approximately 20 µm. A syringe is connected to one end of the capillary tubes. In this manner, the tubes can be filled with the nanoink or the liquid polyimide. A schematic of the setup is shown in FIG. b-1. For the printing process the probe approaches the substrate until the liquid meniscus jumps over to the substrate.

As a substrate for this example, we used commercially available 0.012 inch thick polyimide films (for example, KAPTON). The Kapton films were attached to microscope cover-slides, such that they could be easily manipulated. During the deposition process, the probe was constantly observed and, in some cases, moved in the z-direction to maintain a constant liquid film height.

In a first step, the nanoink was deposited on the polyimide film. The pattern to be written onto the film was controlled via a Labview program. This first layer of the chip was then cured and sintered on a hotplate. For sintering, the substrate was brought in a sequence of steps up to about 300° C.: it was heated over about 10 min to 220° C., maintained at this temperature for about 10 min, it was then brought to 300° C. for another 10 min and kept there for about 10 min. In a final step the sample was cooled down to room temperature. After the sintering process of the first gold layer, the intermediate polyimide layer was written in the same way. We used a liquid polyimide (P84-Typ70 by Degussa Inspec fibres). This solution has a viscosity of 70 Pa-s (Pascal-seconds), comparable to that of honey. The liquid polyimide can either be heated or diluted to make it less viscous. We opted to dilute the solution with DMF (Dimethylformamid) such that we obtained a solution of nearly 7 Pa-s. For the production of the second gold layer we proceeded in the same way as for the first gold layer.

We produced a structure of two gold layers separated by a polyimide layer as shown in FIG. b-2. The profiles of the gold tracks were investigated by shear force microscopy. Results are shown in FIG. b-3. On the average, the lines have a width of about 60 µm and a height of about 500 nm. The thickness of the polyimide layer was also determined by shear force microscopy to be of the same order of magnitude as the height of the gold tracks (about 500 nm). A picture of the structure is shown in FIG. b-4. Several experiments were made to explore potential applications for this process. A circuit with two luminescent diodes as shown in FIG. b-5 was printed. The elements in the circuit were connected with gold tracks produced as explained above. The elements of the circuit were connected to the gold tracks with a conducting silver paste. As can be seen in the picture in FIG. b-6 the diodes function (that is, light up) demonstrating that the gold tracks can be used in the manufacturing of electronic circuitry.

To test compatibility of this method with wire bonding, we used an ultrasonic wedge-wedge bonder with Al wire (Delvotec FEK 5425). The gold tracks for these samples were printed on glass and on polyimide substrates. In the wire-bonder an Al wire is bonded to a connection pad by input of energy through ultrasonic vibrations. The gold pad can either act as a destination or as a starting point for the wire.

Our work with glass substrates showed that even though the gold lines resist a scotch tape test, adhesion is not enough to resist consistently wire retraction during wire bonding. For polyimide samples (KAPTON) no bonding was be achieved. This is most probably due to the fact that the substrate was not rigid enough. During the bonding process a needle pushes the wire onto the Au pad. Because of the energy input described above the matter melts at the bonding point such that the wire is fixed on the pad. In our case, however, the polyimide substrate retreats under the imposed pressure, this inhibits the bonding process. An example of a bond on a glass substrate is shown in FIG. b-7. On the left hand side of the picture one can clearly see the damage (no adhesive bond were made to the pad), whereas on the right a good bond is shown.

B.4. Conclusions

We have demonstrated applications of micro patterning with gold nanoparticle suspensions using the fountain pen principle. We anticipate that this technology will find many applications in the manufacture of microelectronics. Gold nanoparticle-based conductors are well suited for many classes of new applications that arise in the field of electronics. Due to the low melting temperatures of nanoparticles, they can be applied to a variety of substrates including flexible polymeric substances. Deposition techniques such as the fountain-pen setup shown here, are highly flexible and very well adapted for online production of small batch numbers. In contrast to more traditional manufacturing technologies they have a large optimization potential towards smaller structures. A large variety of composite materials can be deposited in this way. Thus, we have demonstrated that gold nanoparticle-based conductors can be used to manufacture electronic circuits and that multilayer structures are feasible.

B.5. References b-1. N. Bieri, J. Chung, S. E. Hafer, D. Poulikakos, C. P. Grigoropoulos; *Applied Physics Letters*, Vol. 82, No 20, pp. 3529-3531, 2003.

b-2. J. Chung, S. Ko, N. R. Bieri, C. P. Grigoropoulos, D. Poulikakos; *Applied Physics Letters*, Vol. 84(5), 2004.

b-3. T. Y. Choi, D. Poulikakos, C. P. Grigoropoulos; *Applied Physics Letters*, Vol. 85, pp. 13-15, 2004.

b-4. J. Chung, S. Ko, C. P. Grigoropoulos, N. R. Bieri, C. Dockendorf, D. Poulikakos, "Damage-free Low Temperature Pulsed Laser Printing of Gold Nanoinks On Polymers," *ASME Journal of Heat Transfer*, accepted for publication, 2005.

Example C: Subtractive Laser Processing of Low Temperature Inkjet Printed Micro Electric Components of Functional Nano-Ink for Flexible Electronics.

The contents of all references cited in this Example C are incorporated herein by reference for all purposes.

C.1. Summary

Examples of low temperature fabrication of electrical components on flexible substrates are presented. As an additive process, combined with a CAD tool, a drop-on-demand (DOD) inkjetting system was used to print electrical components from gold nano-particles suspended in Alpha-Terpineol solution on flexible polymer substrates. In a subtractive process, Nd:YAG pulsed laser was irradiated to produce finer electrical components. Continuous Ar laser was irradiated locally to evaporate carrier solution as well as to sinter gold nano-particles. It is demonstrated, that the melting temperature depression of gold nanoink, combined with local laser heating and ablation can be used to fabricate micro electric components on low melting temperature polymer substrate to realize flexible electronics.

C.2. Introduction

Direct printing of functional material has gained significant interest as an alternative to conventional integrated circuit (IC) process, especially in the area of flexible electronics.

Conventional lithographic processes are well developed for the patterning of inorganic microelectronics. However, polymer substrates are often chemically incompatible with resists, etchant and developers used in conventional IC process. Besides, limitations exist in conventional IC fabrication processes that are multi-step, involve high processing temperatures, toxic waste, and are expensive. Among direct printing techniques; one can distinguish micro contact printing [refs. c-1, c-2,c-3], thermal imaging [ref. c-4], solid state embossing [ref. c-5], screen printing [ref. c-6,c-7], slide-off transfer printing [ref. c-8, ref. c-9] and drop-on-demand (DOD) ink jet printing [ref. c-10 to ref. c-14], laser induced forward transfer (LIFT) [refs. c-15, c-16].

Compared with other direct printing techniques, inkjet printing does not require masking; master pattern as in soft lithographic printing and stamps used in contact printing and imprinting. The fully data driven and maskless nature of drop on demand (DOD) ink jet processing allows more versatility than other direct printing methods. The material is deposited in a carrier solution on the substrate by a piezo electrically driven micro capillary tube. This solution processing provides enhanced flexibility for choosing both the depositing and the substrate material. The resolution of the inkjet process is mainly governed by the nozzle diameter (about the same as the droplet diameter) and the statistical variation of the droplet flight and spreading on the substrate. The currently achievable minimum feature size is limited by the nozzle size and is of the order of 50 µm-100 µm [ref. c-20]. Hybrid inkjet printing methods are being developed to overcome the resolution of current DOD inkjet processing. Hybrid inkjet printing can be configured either in a pre process or a post process sequence. Sirringhaus [ref. c-11] applied a surface energy patterning technique and demonstrated all-polymer transistors with minimum 5 µm channel length. In this method, the high line edge resolution was obtained by spreading ink on the hydrophilic area pre-patterned by photolithography, etc. As a post process, Bieri and Chung irradiated laser locally to define small feature on the printed nanoink [refs. c-17, c-18, c-19]. As a subtractive post process, Ko and Chung [ref. c-21] demonstrated that ultra-short pulsed laser can ablate nanoparticle film to obtain several micron minimum feature size. Since the laser-based hybrid printing is a data driven process (i.e., does not require mask process such as surface patterning technique), it can be more compatible to direct inkjet writing.

In this example, gold nanosized particles (in the approximate range from about 1 nm to about 3 nm diameter) in an Alpha terpineol solution carrier were ink-jetted on a polymer substrate. Nanoparticles were used in order to exploit the significant depression of melting temperature compared to bulk gold (1063° C.) due to the thermodynamic size effect [ref. c-22]. Nd:YAG pulsed laser (532 nm wavelength, about n3 ns to about 5 ns pulse width) was applied to ablate the deposited gold nanoparticle film. Ar ion continuous laser (514 nm wavelength) was used to irradiate and to sinter the gold nanoparticles. Parametric study on pulsed laser energy for ablation and continuous laser power with sintering was carried out. Finally, the resistor performance was evaluated.

C.3. Abbreviations

A=Cross sectional area of the test sample[$m^2$]

D=focal spot diameter of the objective lens ($1/e^2$ basis)

f=frequency (Hz)

NA=numerical aperture of the objective lens

I=power density of incident laser beam [W/$cm^2$] L=Length of the test sample[m]

$\rho$=Resistivity[$\Omega \cdot m$]

R=Resistance[$\Omega$]

ë=wavelength of the laser beam [nm]

C.4. Experiment

C.4.1. Preparation of Monodispersed Metal Nano-Crystals

Gold nanoparticles were prepared by a two-phase reduction method, described by Brust, Shiffrin, and co-workers [ref. c-23]. In general, aqueous metal salts (HAuCl4) are mixed in a toluene solution containing long-chain alkylammonium surfactants to form a two-phase system. Vigorous stirring for about 1 to 3 hours transfers the metal salt into the organic phase, which is then separated. A measured quantity of capping agent, typically a long-chain thiol (Hexanethiol), is added to the solution while stirring, and then a reducing agent (NaBH4) is rapidly added to nucleate nano-crystals [ref. c-24]. The average nano-crystal size is in the approximate range of 1 nm to 3 nm and the size is coarsely tunable by adjusting the ratio of capping groups to metal salt, whereas size selective precipitation is employed to narrow the initial size distribution.

Monolayer-protected gold nanoparticles are suspended in Alpha-terpineol with 10% in weight. The reflectivity of printed nanoparticle film starts to increase and electrical resistivity starts to decrease at a curing temperature of about 130° C. to about 140° C. According to these results, surface monolayer (Hexanethiol) is deduced to be detached from the nanoparticle at temperatures of about 130° C. to about 140° C., which initiates the sintering of gold nanoparticles. We refer to this temperature as the "sintering initiating temperature" for brevity.

C.4.2. Drop on Demand (DOD) Printing System

Micro lines of nanoink were deposited on a polyimide film by the generation of micro-droplets using the piezoelectric drop-on-demand (DOD) printing system (FIG. c-1). The DOD jetting system is composed of a backpressure controller, a purging system. A detailed description of the experimental system is given refs. c-17 through ref. c-21.

The vacuum chuck temperature was maintained at a temperature of about 100° C. in order to heat the jet head nozzle by air conduction to reduce viscosity of Alpha-terpineol down to jettable range (approximately 0.5 cp to about 40 cp, cp=centipoise). The temperature of the vacuum chuck is controlled to within about ±2° C. Vacuum (of about 300 mbar, millibar) is applied through 0.5 mm diameter holes to attach the polymer film on the vacuum chuck (FIG. c-1). About 10 mbar vacuum is maintained in the nanoink reservoir to prevent nanoink from leaking from the nozzle of the capillary tube. A vacuum controller and a magnetic valve were connected between the vacuum pump and the reservoir to minimize the loss of solvent due to continuous evaporation. To purge the clogging, pressure controlled nitrogen gas is used and the purging pressure was controlled at 0.4 psi.

MicroFab's solder-jet head with a 40 μm nozzle diameter is used to produce micro droplets, and a bipolar voltage waveform with amplitude in the range of about ±9 V to about ±10V is applied. The signal generator used to produce microdroplets also triggers the CCD camera, so that the CCD captures images at the droplet generation frequency. The CCD camera provides in-situ "frozen" images of the droplet to check stable droplet generation as well as to measure the droplet velocity and size. After generating stable nanoink droplets of around 40 μm diameter at 10 Hz, a continuous line was printed on the polymer film by moving a precision translation stage at 0.2 mm/s. The gap between the inkjet nozzle and the substrate was maintained at about 2 mm.

C.4.3. Nd:YAG Laser Ablation

After the deposition of gold nanoparticle ink on the substrate by the DOD inkjet printing, short pulsed laser is applied to define finer features. In the experimental variance discussed herein, Nd:YAG nanosecond laser pulses with about 3 ns to 5 ns pulse width, 532 nm wavelength ($\lambda$) and 10 Hz frequency (f) were used. FIG. c-2 shows a schematic of the micromachining workstation including the in-situ imaging setup. A long working distance objective lens (20× (NA=0.42), 100× (NA=0.7)) was used to focus the laser beam down to the diffraction limit. The diffraction limited focal spot of the Gaussian beam was about D=2.27 μm (20×), D=1.36 μm (100×) on $1/e^2$ basis.

The same objective was used for in-situ monitoring of the sample surface combined with a zoom lens, a CCD camera by the white light source. The white light beam was combined with the laser beam by a dichroic mirror (DM). The acquired in-situ surface image provides a useful means for adjusting the focus of the objective lens on the sample surface.

The energy of the pulsed laser was in the range of about 0.4 μJ to about 40 μJ. The laser beam fluence imparted by the 20× objective lens was in the range from about 10 J/$cm^2$ to about $10^3$ J/$cm^2$ based on the above beam diameter. For finer adjustment of the beam energy, a half waveplate ($\lambda/2$) and a polarizing beamsplitter (PBS) were used, permitting only P polarized light through the polarizing beamsplitter. To align the sample normal to the laser beam, the tilting angle of the sample was adjusted.

C.4.4. Ar Ion Laser Sintering

For sintering, an Ar ion laser beam ($\lambda$=514 nm) was irradiated at the center of a printed line with 45° of incidence angle (FIG. c-3). The substrate was placed on a translation stage and in-situ images were taken by a fixed microscope. A long working objective lens (20×) was used and a filter eliminated reflected Argon laser from the sintered gold line. The focused beam waist ($1/e^2$) along the minor axis that is perpendicular to the printed line is 27 μm and the beam waist along the major axis is 38 μm. The translation stage moved at about 0.1 mm/s. The applied laser power was in the range of about 5 mJ to about 100 mJ.

C.5 Results

C.5.1. Single Shot Ablation

After defining finer features using nanosecond laser ablation, surface monolayer and residual solvent should be removed and nanoparticles are to be sintered to form high quality, electrically conducting microstructures. Sintering could be done by substrate heating or by continuous laser irradiation. Local laser heating is advantageous, since the heat-affected zone can be reduced or minimized. This is in turn advantageous for many applications on polymer substrates with low transition/melting temperature. Detailed process optimization for nanocrystal sintering using laser radiation can be found in refs. c-17 through ref. c-21.

Ablation of nanoparticle film was investigated by single shot tests at various energy levels. The gold nanoink was spin-coated to form substantially uniform film (around 2 μm in thickness) on a glass substrate. Long working 20× objective lens (NA=0.42) was used to focus the pulsed laser on the gold nanoink thin film. The nanocrystals used in this experiment were observed to start to sinter around 140° C. One sample was prepared at 120° C. and the other sample was prepared at 160° C. to investigate the sintering effect on ablation.

FIG. c-4 shows an AFM scanned cross section and the topography image for single shot ablation with 20× objective lens. The ablated cross section of the sample that was sintered at 120° C. (FIG. c-4(a)) exhibits a smooth Gaussian profile in accordance with the incident intensity distribution. As the ablation energy increases, the ablation depth also increases until the ablation penetrated through the film and reached the substrate. This was observed first to occur at about 5 μJ. Compared with the 120° C. sample, the ablated cross section of the 160° C. sample (FIG. c-4(b)) shows relatively elevated outer rim structure. This is attributed to thermocapillary effects taking place in the transient melting and the subsequent resolidification. It is recalled that the outer rim is often observed in both thin film and bulk metal ablation. The ablation crater was confined to the central portion of the Gaussian beam. Correspondingly, the fluence exerted upon the outer rim region should lie between the melting and ablation threshold levels. The clean, rimless ablated for the 120° C. sample may possibly be explained by the poor conductive heat transfer across the surface monolayer-protected nanoparticles and the explosive evaporation of residual solvent that may still be trapped in the film.

It is observed that the two samples in FIG. c-4 are prepared from the same initial spin coated sample, but the film thickness is different. FIG. c-5 shows the cross section evolution of one drop of gold ink as the temperature increases. The profile keeps changing even after the change of the deposit color from black to gold around 140° C. This shows that the packing density keeps increasing even after the sintering is initiated and there are no sharp full melting transitions to make bulk gold.

C.5.2. Multi Shot Effect

Multiple nanosecond laser shots were irradiated onto the nanoparticle film with 1.2 μJ of incident laser energy and otherwise the same experimental conditions as single shot ablation. The results of multi-shot irradiation showed a similar trend as the single shot experiment. With the sample which was cured at 120° C., the ablated portion increases proportionally with the number of laser shots as shown in FIG. c-6 (a) and four shots at 1.2 μJ of incident laser energy could make similar features as could a single shot at 5 μJ. For the 160° C. sample, the shape of the outer rim deformed upon multi shot exposure, but the overall crater shape did not change significantly once the crater punched through the metal film (FIG. c-6(b)).

C.5.3. Beam Diameter Effect

The 100× objective lens (NA=0.7) imparts a smaller focal spot diameter (1.36 μm) than the 20× objective lens beam diameter. Laser energy from about 0.4 μJ to about 0.8 μJ was used and the corresponding fluence was from about 7.8 J/cm² to about 15.5 J/cm².

FIG. c-7 shows single- and multi-shot irradiation with the 100× objective lens. Approximately 2 μm minimum feature could be made. In the case of multi-shot experiments, the ablated volume increases with the number of laser shots, but not proportionally. Instead, the overall crater diameter increases with the number of laser shots. This could be caused by the defocusing of the incident laser beam, because the depth of focus is comparable with the thickness of the nanoparticle film. It is noted that the feature size is limited by the beam size and smaller size can be obtained by using either shorter wavelengths or higher NA objective lens.

C.5.4. Resistivity

After pulsed laser ablation to define finer features, residual solvent is advantageously evaporated and nanocrystals are to be sintered to form low resistivity conducting microstructures. Continuous Ar ion laser (λ=5 14 nm) was used to irradiate. The sintering process is dependent on the intensity of incident laser and the laser scanning speed. Electrical resistivity (ρ) measurement is conducted to characterize the produced microlines.

Based on the previously described single- and multi-shot ablation experiment, 1.2 μJ energy was applied with the 20× objective lens (FIG. 8). Gold nanoink was inkjetted to make continuous line on polyimide substrate at 100° C. The test sample is composed of two pads (1 mm by 0.1 mm) for resistance measurement probe. These two pads are connected by narrow gold nanoink lines (in the range from about 10 nm to about 100 μm width) which are defined by pulsed laser ablation. The remaining parts near the central narrow line are isolated dummy parts. The AFM picture in FIG. c-8 shows 8 μm width, 40 nm height line with sharp ablation edge on polyimide substrate. Usually for the ink jet processing, most nanoparticles are deposited at the edge of the droplet, which is often referred to as the "coffee stain problem." [ref. c-21]. This film non-uniformity can cause problems when another layer needs to be deposited on top of it. However, the central part shows very good uniformity. Thin, narrow and uniform micro lines can be obtained.

The resistivity was calculated from the following equation.

$$\rho = R \cdot A/L, \quad \text{(Eq. c-1)}$$

where R is the resistance, A the cross sectional area and L the length of the test sample. R was measured with a micro needle probe station. A was measured from AFM scanning data and L was fixed at 1 mm. FIG. c-9 shows the resistivity at various Ar laser sintering powers from 15 mW to 100 mW. Significant brightness change is observed starting from about 10 mW irradiated power. This corresponds to 1.37 kW/cm² based on 27 μm beam waist (1/e²). Polyimide film deformed significantly for power exceeding 100 mW (13.7 kW/cm²). At lower power, the sintering process is not complete and the resistivity is still relatively large. As the power increases, the resistivity decreases. The resistivity decreases dramatically around 25 mW (3.43 kW/cm²) and does not show great difference above 75 mW (10.3 kW/cm²). The minimum resistivity (5.4×10⁻⁸ Ωm) was almost two times higher than the bulk value (2.65× 10⁻⁸ Ωm, solid line in FIG. c-9).

C.6 Conclusions

Surface monolayer protected gold nanocrystals were synthesized by chemical two-phase method with about 1 nm to 3 nm size distribution. Nanoparticles were suspended in Alpha-terpineol carrier solution and deposited on substrate by piezoelectrically driven ink jet head. After deposition, nanosecond pulsed laser (Nd:YAG laser) was applied to ablate deposited nanoparticle film from the substrate in order to overcome the resolution limitation of the current ink jet printing method. Finally, continuous Ar ion laser was applied to evaporate residual solvent and sinter nanoparticles to form low resistivity microstructure.

Nano particles possess low melting temperature due to thermodynamic size effect compared with bulk counter part [ref. c-22]. This sintering process could be done with a heater, however laser processing (sintering, ablation) can provide a much better controlled method with localized thermal control [ref. c-25].

Ablation characteristics were investigated with various laser pulse energies and both single-shot and multi-shot modes. Samples were prepared at 120° C. (before sintering) and 160° C. (after sintering) to investigate sintering effects. Craters with high outer rim structures were produced in nanoparticle films cured at 160° C. This deformation is believed to be due to the melting and subsequent resolidification process. However, the sample prepared at 120° C. showed rimless crater. This may be due to the poor conductive heat transfer across the surface monolayer-protected nanoparticles and the explosive evaporation of residual solvent that may still be trapped in the film. When the sample was cured at the temperature less than 100° C., the nanoink still contained a substantial amount of solvent. It is noted that samples prepared at temperatures higher than the sintering temperature (140° C.), exhibit elevated ablation threshold. The ablation in this regime is observed to be similar to that of gold thin film ablation. By using the 100× objective lens with numerical aperture (NA) of 0.7, features as small as 2 μm could be defined via ablation.

Finally, a test feature for resistivity measurements on polyimide film was prepared by pulsed laser ablation (8 μm×1 mm×40 nm). Minimum resistivity of $5.4 \times 10^{-8}$ Ωm was obtained without deformation of polymer substrate.

C.7 References c-1. Zscheieschang, U., Klauk, H., Halik, M., Schmid, G., Dehm, C., 2003, "Flexible Organic circuits with printed gate electrodes", *Adv. Mater.* 15(14), pp. 1147-1151.

c-2. Loo, Y. L, Someya, T., Baldwin, K. W., Bao, Z., Ho, P., Dodabalapur, A., Katz H. E., Rogers, J. A., 2002, "Soft, conformable electrical contacts for organic semiconductors: High-resolution plastic circuits by lamination", *Applied Physics Sciences*, 99(16), pp. 10252-10256.

c-3. Zaumseil, J., Someya, T., Bao, Z., Loo, Y. L., Cirelli, R., Rogers, J. A., 2003, "Nanoscale organic transistors that use source-drain electrodes supported by high resolution rubber stamps", *Applied Physics Letters*, 82(5), pp. 793-795.

c-4. Blanchet, G. B., Loo, Y. L., Rogers, J. A., Gao, F., Fincher, C. R., 2003, "Large area, high resolution, dry printing of conducting polymers for organic electronics", *Applied Physics Letters*, 82(3), pp. 463-465.

c-5. Stutzmann, N., Friend, R. H., Sirringhaus, H., 2003, "Self-Aligned, Vertical-Channel, Polymer Field-Effect Transistors", *Science*, 299, pp. 1881-1884.

c-6. Markovic S, Pejovic V, Mitric M, Cvjeticanin N, Makovec D, Uskokovic D, 2004, "Screen printed BaTiSnO3 multilayer materials", *Progress In Advanced Materials And Processes Materials Science Forum*, 453-454: 459-464.

c-7. Krebs F C, Alstrup J, Spanggaard H, Larsen K, Kold E, 2004, "Production of large-area polymer solar cells by industrial silk screen printing, lifetime considerations and lamination with polyethyleneterephthalate", *Solar Energy Materials And Solar Cells*, 83 (2-3), pp. 293-300.

c-8. Hyodo T, Maeda K, Ito T, Sasahara K, Shimizu Y, Egashira M, 2004, "Microstructural control of BaTiO3 thick film fabricated by utilizing slide-off transfer printing", *Journal Of Electroceramics*, 13 (1-3), pp. 519-524.

c-9. Hyodo T, Tominaga Y, Yamaguchi T, Kawahara A, Katsuki H, Shimizu Y, Egashira M, 2003, "NOx sensing properties of WO3-based semiconductor gas sensors fabricated by slide-off transfer printing", *Electrochemistry*, 71(6), pp. 481-484.

c-10. Ridley, B. A., Nivi, B., Jacobson, J. M., 1999, "All-Inorganic Field Effect Transistors Fabricated by Printing", *Science*, 286, pp. 746.

c-11. Wang, J. Z., Zheng, Z. H., LI, H. W., Huck, W. T. S., Sirringhaus, H., 2004, "Dewetting of conducting polymer droplets on patterned surfaces", *Nature*, 3, March 2004, pp. 171-176.

c-12. Knobloch, A., Manuelli, A., Bernds, A., Clemens, W., 2004, "Fully printed integrated circuits from solution processable polymers", *Journal Of Applied Physics*, 96(4), pp. 2286-2291.

c-14. Volkman, S. K., Molesa, S., Mattis, B., Chang, P. C., Subramanian, V., 2003, "Inkjetted Organic Transistors using a Novel Pentacene Precursor", *Mat. Res. Soc. Symp. Proc.* 769.

c-15. Zhang, C., Liu, D., Mathews, S. A., Graves, J., Schaefer, T. M., Gilbert, B. K., 2003, "Laser direct-write and its application in low temperature Co-fired ceramic (LTCC) technology", *Microelectronic Engineering*, 70, pp. 41-49.

c-16. Tan, B., Venkatakrishnan, K., Tok, K. G., 2003, "Selective surface texturing using femtosecond pulsed laser induced forward transfer", *Applied Surface Sci.* 207, pp. 365-371.

c-17. Bieri, N. R., Chung, J., Haferl, S. E., Poulikakos, D., Grigoropoulos, C. P., 2003, "Microstructuring by printing and laser curing of nanoparticle solutions," *Appl. Phys. Lett.*, 82(20), pp. 3529-3531.

c-18. Chung, J. Ko, S., Bieri, N. R., Grigoropoulos, C. P., Poulikakos, D., 2004, "Conductor microstructures by laser curing of printed gold nanoparticle ink," *Appl. Phys. Lett.*, 84(5), pp. 801-803.

c-19. Chung, J., Ko, S., Bieri, N. R., Grigoropoulos, C. P., Poulikakos, D., 2003, "Laser curing of nanoparticle suspended solution," *Proc. of 2003 ASME IMECE*, Washington, D.C.

c-20. Chung J, Bieri N R, Ko S, Grigoropoulos C P, Poulikakos D, 2004, "In-tandem deposition and sintering of printed gold nanoparticle inks induced by continuous Gaussian laser irradiation", *Applied Physics A-Materials Science And Processing.* 79 (4-6), pp. 1259-1261.

c-21. Ko S, Chung J, Choi, T, Grigoropoulos C P, Bieri N R, Choi, T., Dockendorf, C. Poulikakos D, 2005, "Laser based hybrid inkjet printing of nanoink for flexible electronics", *Photonics West*, 2005, San Jose, Calif.

c-22. Buffat, P. A., and Borel, J. P., 1976, "Size effect on the melting temperature of gold particles," *Phys. Rev. A.*, 13(6), pp. 2287-2298.

c-23. Brust, M., Walker, M., Bethell, D., Schriffin, D. J., and Whyman, R. J., 1994, "Synthesis of thiol-derivatised gold nanoparticles in a two-phase liquid-liquid system," *Chem. Soc., Chem. Commun.,* 7, pp. 801-802.

c-24. Murray C. B., Kagan C. R., 2000, "Synthesis and Characterization of monodisperse nanocrystals and close packed nanocrystals assemblies", *Annu. Rev. Mater. Sci.,* 30, pp. 545-610.

c-25. Choi, T, Poulikakos D, Grigoropoulos C P, 2004, "Fountain-pen-based laser microstructuring with gold nanoparticle inks", *Appl. Phys. Lett.,* 85(1), pp. 13-15.

The above examples show that the morphology and quality of the cured line is influenced by the spatial intensity distribution of the curing laser. In particular, it has been found that using a specially tailored laser intensity profile, typically having at least two spatially separated intensity maxima, can be advantageous. In example 5, such a distribution was generated with two separate laser beams impinging on substrate, 1, at opposite sides of, and symmetrical to, a center line, 19, of line strip, 4. In general, using a light intensity distribution that has a local minimum on center line, 19, is advantageous for a line strip having a flat thickness profile.

The arrangement of FIG. 5 is only one of several possibilities for generating such an intensity distribution. In particular, the two laser beams may also be non-intersecting and/or parallel. Alternatively, a single non-Gaussian intensity distribution which can e.g., be generated using a suitable mask, diffractive optics, phase-shift mask, and/or using a higher mode of the laser instead of a Gaussian TEM-00 (Tranverse ElectroMagnetic) mode.

Furthermore, more than two laser beams can be used, e.g., two on each side of center line, 19.

It is observed that the morphology of deposited gold is closely related to the evaporation of the carrier solvent and the electrical resistance is related to the maximum temperature experienced by the nanoparticle (i.e., the extent of melting of the nanoparticles). Therefore, two lasers can be applied to control the evaporation (i.e., morphology) and the melting, respectively.

In the above examples, a cw-laser with a continuous laser beam has been used. Alternatively, a pulsed laser can be employed or the continuous laser can be temporally modulated. The application of repetitively pulsed curing light with pulses in the millisecond, microsecond, picosecond, or even femtosecond range has the advantage that higher peak powers can generate higher peak temperatures at the point of impact without additionally heating the bulk of substrate, 1.

The temperature field in substrate, 1, depends on the laser pulse duration. The thermal penetration depth scales as $$\sqrt{\alpha t_{pulse}}$$

Where $\alpha$ is the thermal diffusivity of the material and $t_{pulse}$ the laser duration. For typical thermal diffusivity of glass at $10^{-6}$ m²/s, the thermal penetration depth is of the order of 10 microns for laser pulse duration of 100 microseconds. For polymers, the depth is somewhat shallower for the same pulse duration due to the lower thermal diffusivity. On the other hand, the maximum temperature at the surface of the material at the end of the pulse is proportional to $$1/k\sqrt{\alpha t_{pulse}}$$

Where k is the thermal conductivity of the material. Hence, both the thermal penetration-depth and the maximum temperature rise can be controlled by adjusting the laser pulse duration. The thermal penetration depth defines the heat-affected-zone, i.e., the region that is subjected to temperature gradients and thus to thermal stress. In the case of glass and polymer materials, we keep in mind that the material volume subjected to temperatures above the glass transition temperature may be subjected to permanent deformation. In addition, the applied cooling rate is also important in affecting or avoiding permanent deformation.

It is expected that further improvement of the process can be accomplished by superimposing tailored trains of pulses of different pulse durations and waiting periods between the pulses. This can be easily done using acousto-optical modulators, among other conventional light-manipulation devices. In addition, different lasers can be used in tandem. For example, a millisecond laser can be used to raise the temperature field to a preheat temperature distribution synchronized with a following laser pulse. The following laser pulse can then be used to drive the peak temperature to the desired level for sintering. The curing process that happens by heat diffusion across the sintered gold film ahead of the laser beam can thus be sustained without overheating and damaging the substrate.

When building multi-layer structures, electrically insulating materials also act as thermal barriers to heat transfer. By controlling the temporal dependence of the laser pulse, thermal damage to buried sensitive parts can be reduced without packing excessive insulator.

Specific techniques for generating pulsed laser pulses, e.g., with modulators outside or within the laser's cavity, are conventional techniques in the field of laser technology and applications, known to the person skilled in the art.

For expediting the melting or sintering of the nanoparticles, the substrate and/or suspension can be heated to a temperature below the melting point of the nanoparticles by a means separate from the laser light, e.g., a resistive heater element below the substrate, thereby decreasing the amount of energy required from the laser. In particular, the substrate temperature may be sufficiently high to cause at least partial evaporation of the "solvent" before the nanoparticles are brought into contact with the laser light at curing point, 6b, of the laser beams. In this case, the power provided by the laser can be lower because no laser energy is required for removing the solvent.

As mentioned above, laser curing can take place during or after deposition of the drops on the substrate. In addition, laser light can be used to locally heat the substrate before the deposition of the drops on the substrate, thereby expediting or achieving evaporation of the solvent and, if desired, also sintering of the nanoparticles.

Instead of being present in the form of a regular suspension (i.e., a solid in liquid suspension), layer, 4, may also be formed by a "solid suspension", i.e., the nanoparticles can be suspended in a solid matrix, e.g., by solidifying the "solvent" after printing by temperature decrease or partial evaporation. Alternatively, the nanoparticles can be suspended in a gas.

A very rugged device can be obtained when the emitter or emitters for the curing light are integrated with droplet generator, 2, into a single printing head. For example, as shown in FIG. 8, one or more laser diodes, 5a, 5b, may be integrated in a head, 20, together with the droplet generator. The light beams, 16a, 16b, from the diodes, 5a, 5b, are e.g., focused on the spot where the droplets impinge on the substrate. Alternatively, only part of the light source, such as optical fibers and micro-optical components connected to an external laser, may be integrated in the printing head. This approach may ensure precise delivery of the laser beam onto the deposited suspension droplet, thereby maintaining the focal depth, beam size and positioning. Arrays of multiple units of nozzle/fiber coupled laser beams may increase the process throughput.

In the above examples, the suspension layer or line strip, 4, has been formed by applying drops generated by droplet generator, 2, to substrate, 1. Instead of a drop-wise application of the suspension, other coating methods, such as spin coating, spray coating, dip coating, gas phase exposure, and the like, can be used for forming the desired structure. Again, the laser light is then used for forming the desired structure.

Besides substrates of silicon or glass, others types of substrates can be used as well, such as substrates of ceramics, plastics, compound semiconductors, and the like. The present method is advantageously suited for being used with a substrate, 1, of a material that is transparent for the laser light, i.e., that has an absorption that is much lower that the one of the nanoparticles, such as glass or a suitable polymer, because a transparent substrate may not be subject to significant undesired heating by the laser light. When using a transparent substrate, the laser light can also be sent from below through the substrate to curing point, 6b.

Various substrates, including flexible materials, polymers, ceramics, semiconductors, metals, and plastics are compatible with the present technique. In addition to metal (gold, silver, copper, aluminum, etc.) nanoparticles, the method can also be applied to semiconductor, superconductor, and ceramic nanoparticles. Furthermore, the deposition of functional materials can alternate with the deposition of polymers for the fabrication of three dimensional (3-D) conductor patterns.

The advantages compared to current manufacturing methods of printed wiring or circuit boards are manifold. The present methods save expensive materials by only depositing material at desired places on the substrate and then fully utilizing the entire nanoparticle material. The novel process presented herein is straightforward and fast. The desired pattern can be designed with appropriate Computer Aided Design (CAD)/Computer Numerical Control (CNC) software. Taking advantage of the unique property of gold ultra fine particles (UFPs) to melt and bond at low temperatures makes the printing of gold microline interconnections possible via on-demand microdroplet generation where one deals with a room temperature nanosuspension rather than molten gold at a temperature exceeding 1100° C. (melting point 1063° C.). Furthermore, excess thermal stresses and possible melting or even burning of sensitive chip structures can be avoided. The method is expected to be applicable in a normal atmospheric environment yielding a fast, user-friendly and cost-effective interconnection manufacturing process appropriate for use in combination with a variety of delicate substrate materials.

In contrast to a global heating of the substrate, heating by means of laser light further allows one to define the geometry of the cured material and its electrical properties as shown above, and it keeps the global temperature increase within the substrate small.

The method described here can be used for forming virtually any type of structure. Examples are conducting lines for interconnections on or to a semiconductor chip or for connecting a semiconductor chip to a substrate or to connector pins, metallic or non-metallic parts of Micro Electromechanical, Systems (MEMS) or superconducting structures.

Resistors can be made by varying the line width, lines with a larger cross-section having lower resistance. Another way to influence the resistance of a conductor part is by changing the curing parameters. Nanoparticle suspension lines that have been cured to a higher degree (using for example the double laser scheme) show a resistance with is closer to the one for bulk gold.

By coordinating laser heating and substrate movement, curved patterns can be generated. Single or multiple printing and laser passes can be carried out on the same substrate using the same or different nanoparticle materials.

The concentration of the nanoparticles, substrate velocity, illumination intensity, droplet diameter and rate, and pre-impact droplet temperature are parameters that can be optimized according to the specific needs of an application.

A primary application of the present invention is the construction of gold lines for interconnection in electronics manufacturing, ranging from chip assembly packaging to flat panel display construction. The critical benefit to be harvested from the low melting and bonding temperature of the gold nanoparticles is twofold: First, the printing of gold microline interconnections with an on-demand microdroplet generation technique is possible because one deals with a room temperature nanosuspension facilitating the application of piezoelectric ceramics with Curie temperatures of only a few hundred degrees Celsius. This would be impossible with molten gold at temperatures exceeding 1063° C. Second, at the droplet deposition end, excess thermal stress and melting or burning of sensitive chip structures can be avoided. The method can be used under a normal atmosphere environment yielding a fast, user-friendly and cost-effective interconnection manufacturing process appropriate for use in combination with a variety of delicate substrate materials.

Although various embodiments which incorporate the teachings of the present invention have been shown and described in detail herein, those skilled in the art can readily devise many other varied embodiments that still incorporate these teachings.

What is claimed is:

1. A method of forming a nanostructure comprising:
depositing a suspension containing nanoparticles onto a substrate forming thereby a pattern;
ablating said pattern to produce an ablated pattern; and
sintering said ablated pattern to produce said nanostructure.

2. A method as in claim 1, wherein said depositing is drop-on-demand.

3. A method as in claim 1, wherein said ablating is laser ablating.

4. A method as in claim 3, wherein said laser ablating is short-pulse laser ablating.

5. A method as in claim 4, wherein said short-pulse laser ablating is by a laser pulse having a duration in the range from about 1 nanosecond to about 500 nanoseconds.

6. A method as in claim 4, wherein said short-pulse laser ablating is by a laser pulse having a duration in the range from about 2 femtoseconds to about 500 femtoseconds.

7. A method of forming at least two nanostructures comprising:
forming a first nanostructure on a substrate, wherein said first nanostructure is sintered;
depositing a suspension containing nanoparticles onto said substrate forming a pattern thereon;
ablating material from said pattern by laser ablation to produce an ablated pattern, wherein the power of said laser is sufficient for laser ablation of said pattern but insufficient for substantial ablation of said first nanostructure; and
sintering said nanoparticles in said ablated pattern to produce a second nanostructure.

8. A method as in claim 7, wherein said pattern lies at least in part on said first nanostructure.

9. A method of forming a capacitor comprising:
depositing a first suspension to form a bottom electrode of said capacitor;

depositing a dielectric layer at least partially on said bottom electrode;

depositing a second suspension containing nanoparticles in a pattern onto said substrate, wherein said second suspension lies partially on said dielectric layer substantially above said bottom electrode; and sintering said second suspension to form a top electrode of said capacitor, wherein said method further comprises laser ablating to alter the structure of at least one of said bottom electrode, said dielectric layer or said top electrode.

10. A method as in claim 9, further comprising laser ablating said top electrode wherein said laser ablating is selective pulsed laser ablation by differential ablation threshold.

11. A method of forming an organic field effect transistor comprising:

forming a source nanostructure and a drain nanostructure on a substrate wherein said forming comprises depositing a suspension of nanoparticles and sintering; and, forming an organic semiconducting structure between said source nanostructure and said drain nanostructure; and, forming a dielectric layer on said organic semiconducting structure; and, forming a gate electrode on said dielectric layer wherein said forming comprises depositing a suspension of nanoparticles and sintering.

12. A method as in claim 11, further comprising laser ablating at least one of said source nanostructure, said drain nanostructure, said organic semiconducting structure, said dielectric layer or said gate electrode.

13. A method of forming self-aligned channels in an organic field effect transistor comprising:

forming a source nanostructure and a drain nanostructure on a substrate wherein said forming comprises depositing a suspension of nanoparticles and sintering;

defining a channel region between said source nanostructure and said drain nanostructure with laser ablation;

forming an organic semiconducting structure between said source nanostructure and said drain nanostructure;

forming a dielectric layer on said organic semiconducting structure; and forming a gate electrode on said dielectric layer wherein said forming comprises depositing a suspension of nanoparticles and sintering.

14. A method as in claim 1, wherein the substrate is a flexible substrate.

15. A method as in claim 14, wherein the flexible substrate comprises a polymer.

16. A method as in claim 7, wherein the substrate is a flexible substrate.

17. A method as in claim 16, wherein the flexible substrate comprises a polymer.

18. A method as in claim 4, wherein said short-pulse laser ablating is by a laser pulse having a duration in the picosecond range.

19. A method as in claim 4, wherein said short-pulse laser ablating is by a laser pulse having a duration in the microsecond range.

* * * * *